US009386656B2

(12) United States Patent
Tanaka et al.

(10) Patent No.: US 9,386,656 B2
(45) Date of Patent: Jul. 5, 2016

(54) LUMINESCENT SYSTEM AND ORGANIC EL DEVICE

(71) Applicant: KANEKA CORPORATION, Osaka-shi, Osaka (JP)

(72) Inventors: Toshiaki Tanaka, Kusatsu (JP); Nobuhito Miura, Otsu (JP); Katsuhiko Hayashi, Kusatsu (JP)

(73) Assignee: KANEKA CORPORATION, Osaka-shi (JP)

( * ) Notice: Subject to any disclaimer, the term of this patent is extended or adjusted under 35 U.S.C. 154(b) by 161 days.

(21) Appl. No.: 14/379,727

(22) PCT Filed: Feb. 14, 2013

(86) PCT No.: PCT/JP2013/053520
§ 371 (c)(1),
(2) Date: Aug. 19, 2014

(87) PCT Pub. No.: WO2013/125435
PCT Pub. Date: Aug. 29, 2013

(65) Prior Publication Data
US 2015/0035445 A1     Feb. 5, 2015

(30) Foreign Application Priority Data

Feb. 20, 2012  (JP) ................................ 2012-034089

(51) Int. Cl.
*H05B 33/08*     (2006.01)
*H01L 51/52*     (2006.01)
(Continued)

(52) U.S. Cl.
CPC ........ *H05B 33/0896* (2013.01); *H01L 51/0096* (2013.01); *H01L 51/52* (2013.01);
(Continued)

(58) Field of Classification Search
CPC   H05B 33/0896; H01L 51/52; H01L 51/0096; H01L 51/5206
USPC ...................................................... 315/200 R
See application file for complete search history.

(56) References Cited

U.S. PATENT DOCUMENTS

2003/0015805 A1    1/2003  Wakimoto et al.
2004/0012336 A1*   1/2004  Okuda ................. G09G 3/3216
                                                      315/169.1

(Continued)

FOREIGN PATENT DOCUMENTS

DE    102010023550 A1   12/2011
JP        2002289355 A   10/2002
(Continued)

OTHER PUBLICATIONS

European Patent Office, Supplementary European Search Report Issued in Application No. 13751583, Search completed Dec. 3, 2015, Germany, 2 pages.
(Continued)

*Primary Examiner* — Don Le
(74) *Attorney, Agent, or Firm* — Alleman Hall McCoy Russell & Tuttle LLP

(57) ABSTRACT

The present invention aims to provide a luminescent system enabling contactless power supply, having a high ratio of light emission region, and securing a desired quantity of emitted light. The luminescent system is constituted by an organic EL device and a fixed-side wall surface. The device is formed by stacking an electrode layer of an anode side, an organic light-emitting layer, and a transparent electrode layer of a cathode side on a substrate and being sealed by a sealing part. Electrodes with a planar expanse are stacked on a face near the wall surface and are arranged so as to overlap a light emitting region where the organic light-emitting layer is disposed. Electrodes with a planar expanse are embedded in the wall surface. A power unit is electrically connected between the electrodes. The electrodes of the device and of the wall surface are opposite each other across a flooring material.

28 Claims, 13 Drawing Sheets

(51) Int. Cl.
*H01L 51/00* (2006.01)
*H02J 5/00* (2016.01)

(52) U.S. Cl.
CPC ........ *H01L51/5206* (2013.01); *H01L 51/5234* (2013.01); *H01L 51/5203* (2013.01); *H01L 2251/533* (2013.01); *H01L 2251/5315* (2013.01); *H01L 2251/5361* (2013.01); *H02J 5/005* (2013.01)

(56) References Cited

U.S. PATENT DOCUMENTS

| | | | |
|---|---|---|---|
| 2004/0022058 | A1 | 2/2004 | Birrell |
| 2009/0159677 | A1* | 6/2009 | Yakimov ............ H05B 33/0896 235/439 |
| 2009/0184950 | A1* | 7/2009 | Furuta ..................... H02J 5/005 345/211 |
| 2009/0206675 | A1 | 8/2009 | Camurati et al. |
| 2010/0026950 | A1 | 2/2010 | Furuta et al. |
| 2010/0045189 | A1* | 2/2010 | Storch .................... H05B 37/02 315/149 |
| 2011/0298359 | A1 | 12/2011 | Hesse et al. |
| 2013/0057143 | A1* | 3/2013 | Sugimoto ........... H01L 51/5228 313/512 |
| 2013/0334960 | A1* | 12/2013 | Waffenschmidt ... H01L 27/3202 315/52 |
| 2014/0292103 | A1* | 10/2014 | Waffenschmidt .... H04B 5/0012 307/109 |

FOREIGN PATENT DOCUMENTS

| | | |
|---|---|---|
| JP | 2003059649 A | 2/2003 |
| JP | 2004511078 A | 4/2004 |
| JP | 2007220624 A | 8/2007 |
| JP | 2009169327 A | 7/2009 |
| JP | 2009531009 A | 8/2009 |
| JP | 2010032826 A | 2/2010 |
| JP | 2010537613 A | 12/2010 |
| JP | 2011509645 A | 3/2011 |
| WO | 0231406 A1 | 4/2002 |
| WO | 2007107642 A1 | 9/2007 |
| WO | 2009024731 A2 | 2/2009 |
| WO | 2009082566 A1 | 7/2009 |

OTHER PUBLICATIONS

ISA Japanese Patent Office, International Search Report of PCT/JP2013/053520, Japanese Patent Office, May 7, 2013, 4 pages.
International Bureau of WIPO, International Preliminary Report on Patentability and Written Opinion in International Patent Application No. PCT/JP2013/053520, Sep. 4, 2014, WIPO, 10 pages.

* cited by examiner

▨ CONDUCTOR PART

☐ SEMICONDUCTOR PART

■ INSULATOR PART

▨ CONDUCTOR PART
☐ SEMICONDUCTOR PART
■ INSULATOR PART

LUMINESCENT SYSTEM AND ORGANIC EL DEVICE

TECHNICAL FIELD

The present invention relates to a luminescent system and an organic EL device, and more specifically to a luminescent system and an organic EL device enabling contactless power supply.

BACKGROUND ART

Organic EL (Electro Luminescence) devices are attracting attention as a luminescence device taking the place of a light emitting device using a fluorescent light or an LED and have been studied well.

An organic EL device is made by laminating a substrate such as a glass substrate or a transparent resin film with an organic EL element composed of organic compounds and the like. An organic EL element is a light emitting element including an organic light-emitting layer between an anode and a cathode. The organic light-emitting layer is made up of a hole injection layer, a hole transport layer, a light-emitting layer, an electron transport layer, an electron injection layer, and the like.

The organic light-emitting layer and electrode layers constituting an organic EL element are formed in a film state using a device such as a vacuum deposition device or a CVD (Chemical Vapor Deposition; chemical vapor phase growth method) device. Therefore, an organic EL device is considerably thin and light compared with a liquid crystal display or an LED lighting equipment. A thin and light organic EL device is, for example, easily attached to a ceiling or a wall and can be used in various ways as a flexible luminescence device. However, wiring for supplying power to the organic EL device is often embedded in a ceiling or a wall, restricting an installation place of the organic EL device depending on a position of wiring. Patent document 1 specified below discloses a power transmission circuit which can supply AC power to a plate-type display panel in a contactless manner.

The power transmission circuit disclosed in Patent document 1 uses a transmitting board for transmitting AC power and a receiving board provided with a display panel. Two planar electrodes are formed on a surface of each of the transmitting board and the receiving board. The planar electrodes of the transmitting board and the receiving board are arranged so as to be opposite each other across an insulating board, thereby generating electrostatic capacitance between the planar electrodes. It can be said that the electrostatic capacitance is a capacitor, via which the transmitting board and the receiving board are electrically connected (hereinafter referred to as a capacitive coupling method). As a consequence, AC power is supplied from the transmitting board to the receiving board even though they are not connected via wiring or the like.

Furthermore, Patent documents 2 and 3 specified below disclose an electrical energy transmitting device which can supply power by other capacitive coupling methods.

PATENT DOCUMENT

Patent Document 1: JP 2009-169327 A
Patent Document 2: JP 2009-531009 A
Patent Document 3: JP 2010-537613 A

DISCLOSURE OF INVENTION

Technical Problem

In the power transmission circuit described in Patent document 1, the display panel and the planar electrodes are on the same plane without overlapping. In the power transmission circuit described in Patent document 1, the planar electrodes formed on the receiving board sandwich the display panel in a planar view. Specifically, the receiving board has, in a planar view, a region where the display panel is located and a region where the planar electrodes are located. They are positioned separately, so that there is no region where the display panel and the planar electrodes overlap.

Therefore, the employment of the power transmission circuit described in Patent document 1 produces a non-emission region on the surface of the board. In short, a region not contributing to light emission occupies a considerable ratio of the area of the surface of the board.

Increasing the ratio of area of the region of light emission renders the planar electrodes smaller, resulting in decreasing a power reception area. As a result, it is impossible to receive the transmission of power necessary. That may cause a shortage of a quantity of emitted light though the area of the light emission area is increased.

In view of the above-mentioned problems and drawbacks, the present invention therefore aims to provide a luminescent system enabling contactless power supply, having a high ratio of light emission region, and securing a desired quantity of emitted light.

Further, the present invention aims to provide an organic EL device which can solve similar problems and drawbacks.

Solution to Problem

One aspect of the present invention to solve the above-mentioned problems and drawbacks is a luminescent system including a fixed-side wall surface and an organic EL device, the fixed-side wall surface having a wall-side conductive member, the organic EL device being formed by stacking, on a substrate with a planar expanse, two electrode layers and an organic light-emitting layer sandwiched between the two electrode layers, wherein the device has two faces, at least one of which serves as a light-emitting face, the organic El device having a panel-side conductive member with a planar expanse, wherein the panel side conductive member is embedded in or exposed from the other face opposite the light-emitting face in a region overlapping with the organic light-emitting layer, and wherein the panel-side conductive member is electrically connected to the electrode layers, the organic EL device being arranged on the fixed-side wall surface, and the luminescent system being configured to apply an AC current to the wall-side conductive member, so as to indirectly supply power to the organic EL device.

Preferably, the wall-side conductive member is embedded inside the fixed-side wall surface.

The fixed-side wall surface is specifically a ceiling, an inner wall of a room, a floor, a counter surface, an upper face of a desk, or the like. The fixed-side wall surface is a part of a building or a part of furniture, being a member not moving in normal use.

The luminescent system of this aspect employs an organic EL device having a particular configuration. Specifically, the organic EL device employed in this aspect includes a panel-side conductive member. The panel-side conductive member is electrically connected to the electrode layer adapted to supply power to the organic light-emitting layer.

Meanwhile, there is a wall-side conductive member provided at a side (fixed-side wall surface) where the organic EL device is installed. Further, the wall-side conductive member is preferably embedded in the fixed-side wall surface. Upon application of an AC current to the wall-side conductive member, electrons move between the wall-side conductive member and the panel-side conductive member, thereby indirectly supplying power to the organic EL device.

Further, in the organic EL device employed in this aspect, the panel-side conductive member is arranged so as to have a planar expanse on a region overlapping the organic light-emitting layer.

Thus, in the organic EL device employed in this aspect, the panel-side conductive member occupies a wide area, so that the device receives a sufficient amount of electric power supplied through the fixed-side wall surface. Further, the organic EL device employed in this aspect has a high ratio of area occupied by the light emitting region.

Therefore, the luminescent system of this aspect emits light more brightly over a larger area.

Another aspect of the organic EL device desirably employed in the above-mentioned luminescent system is an organic EL device to be placed on a fixed-side wall surface, wherein the fixed-side wall surface has a wall-side conductive member, to which an AC current is to be supplied, embedded therein, the organic EL device being formed by stacking, on a substrate with a planar expanse, two electrode layers and an organic light-emitting layer sandwiched between the two electrode layers, wherein the device has two faces, at least one of which serves as a light-emitting face, having a panel-side conductive member with a planar expanse, wherein the panel-side conductive member is embedded in or exposed from the other face opposite the light-emitting face in a region overlapping with the organic light-emitting layer, and wherein the panel-side conductive member is electrically connected to the electrode layers, and receiving an indirect supply of power from the wall-side conductive member so as to make the organic light-emitting layer emit light.

The organic EL device of this aspect enables contactless power supply and obtains a desired amount of electric power as well as in the above description. Further, the organic EL device in this aspect has a high ratio of area contributing to light emission and is bright.

It is recommended that the organic EL device employed in the above-mentioned luminescent system have a configuration in which the panel-side conductive member is disposed on a face of the device opposite the substrate.

It is naturally possible to use the organic EL device having a configuration in which the panel-side conductive member is disposed on a side of the substrate where the organic light-emitting layer is not stacked.

In the organic EL device, one of the two electrode layers may serve as the panel-side conductive member.

In the luminescent system in this aspect employing this organic EL device, the electrode layer to supply power to the organic light-emitting layer is used as the panel-side conductive member.

Specifically, the organic EL device has two electrode layers, between which the organic light-emitting layer is sandwiched, so that electric power is supplied from the two electrode layers to the organic light-emitting layer.

In the luminescent system in this aspect, since the electrode layer to supply power to the organic light-emitting layer is used as the panel-side conductive member, it is not necessary to dispose a separate member as the panel-side conductive member.

The organic EL device may be a top emission-type organic EL device in which the two electrode layers and the organic light-emitting layer are stacked on the substrate and the face opposite the substrate serves as the light-emitting face.

Alternatively, the organic EL device may be a bottom emission-type organic EL device in which the substrate is a transparent substrate, the two electrode layers and the organic light-emitting layer are stacked on the transparent substrate, and the face near the substrate serves as the light-emitting face.

It is desirable that the AC current applied to the wall-side conductive member have a high voltage and a high frequency.

Further, it is possible to employ the luminescent system further including a passive electrode larger than the wall-side conductive member and a high-tension, high-frequency generator, the high-tension, high-frequency generator being connected to the wall-side conductive member and the passive electrode, the organic EL device having a counter electrode larger than the panel-side conductive member, wherein the counter electrode is arranged at a position different from a position where the panel-side conductive member is disposed, and the organic light-emitting layer being electrically connected to the panel-side conductive member and the counter electrode.

The organic EL device employed in the above-mentioned configuration includes a counter electrode that is larger than the panel-side conductive member. The counter electrode is arranged at a position different from a position where the panel-side conductive member is disposed and the organic light-emitting layer is electrically connected between the panel-side conductive member and the counter electrode.

Further, the device may include a high impedance load connected between the panel-side conductive member and the counter electrode.

It is recommended that the substrate of the organic EL device include a member or a part constituting a rectifying circuit.

It is recommended that the organic EL device be formed by stacking, on the substrate, the two electrode layers and the organic light-emitting layer having a pn junction, and that the substrate has a surface divided into a main light-emitting part and at least one diode part, wherein the diode part allows conduction in only one direction by using the pn junction of the organic light-emitting layer and wherein the diode part is connected to the main light-emitting part.

Further, the organic EL device desirably has four diode parts so as to form a full-wave rectifying circuit including the diode parts.

It is desirable that the main light-emitting part be arranged on a central part of the substrate of the organic EL device and the diode parts be formed around the main light-emitting part.

In a more specific configuration of the organic EL device, the device has an electrode layer dividing part formed in at least one of the electrode layers, wherein the dividing part divides and insulates the electrode layer, further has an organic light-emitting layer dividing part formed in the organic light-emitting layer, wherein the dividing part divides the organic light-emitting layer, one of the electrode layers penetrating the organic light-emitting layer dividing part, thereby forming a conducting part making the two electrode layers be conductive, the diode part having a diode forming part making two adjacent regions with the electrode layer dividing part as the boundary be conductive via a part of the organic light-emitting layer and the conducting part.

Advantageous Effect of Invention

The luminescent system and the organic EL device of the present invention enable contactless power supply and provide a desired amount of electric power. Further, the organic EL device of the present invention has a high ratio of area contributing to light emission and is bright.

DESCRIPTION OF EMBODIMENT

Now, embodiments of luminescent systems and organic EL devices of the present invention will be described in detail below, making reference to the accompanying drawings. The description below is to easily understand the embodiments and is not intended to be understood as limiting the present invention.

Further, a thickness of each layer is exaggeratedly drawn in each drawing for easy understanding of the present invention.

Figure 1:
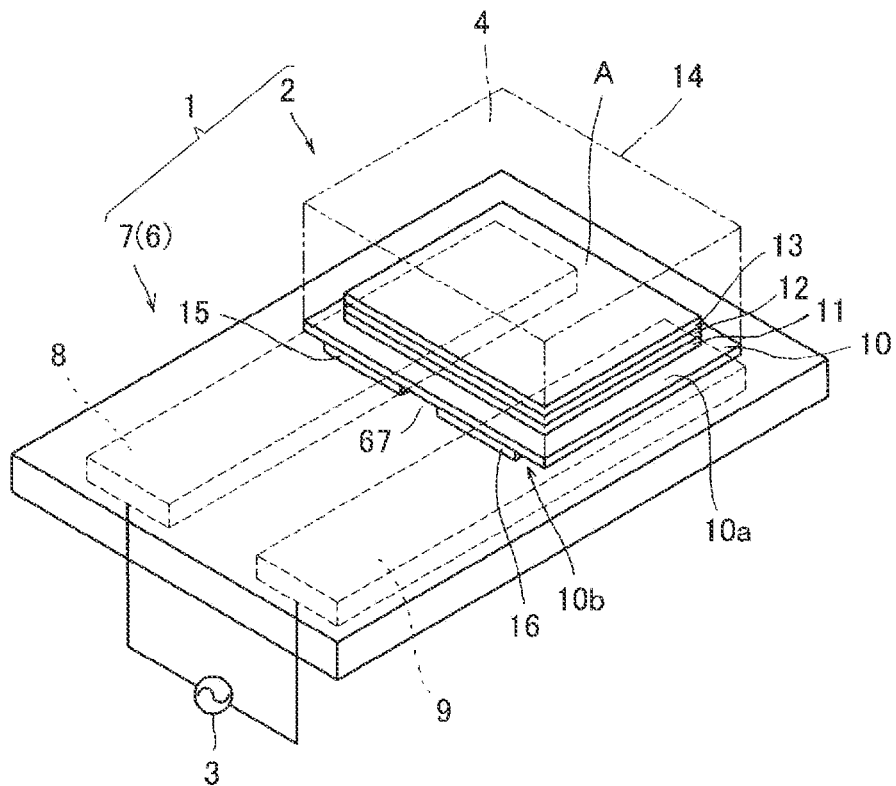
FIG. 1 is a conceptual diagram of a luminescent system relating to a first embodiment of the present invention, being a cross-sectional perspective view showing an organic EL device and a fixed-side wall surface.

Referring to FIG. 1, a luminescent system 1 in a first embodiment of the present invention mainly consists of an organic EL device 2 serving as a light emitting device and a fixed-side wall surface 7 for supplying an AC power source to the organic EL device 2.

The organic EL device 2 is formed by stacking an organic EL element 110 (see FIG. 2) on one surface (an upper face in the drawing) 10a of a substrate 10 with a planar expanse. Specifically, the organic EL device 2 is made up of an electrode layer 11 of a negative electrode (cathode) side, an organic light-emitting layer 12 referred also to as a functional layer, and a transparent electrode layer 13 of a positive electrode (anode) side, which are stacked on the substrate 10 and sealed by a transparent sealing part 14. The organic EL device 2 applies a voltage in between the electrode layer 11 and the transparent electrode layer 13, so as to make the organic light-emitting layer 12 emit light and to extract light from the transparent electrode layer 13. The organic EL device 2, which has a configuration of a so-called top emission type, has an upper face (a face opposite to the substrate 10) 4 serving as a light-emitting face based on FIG. 1.

Figure 2:
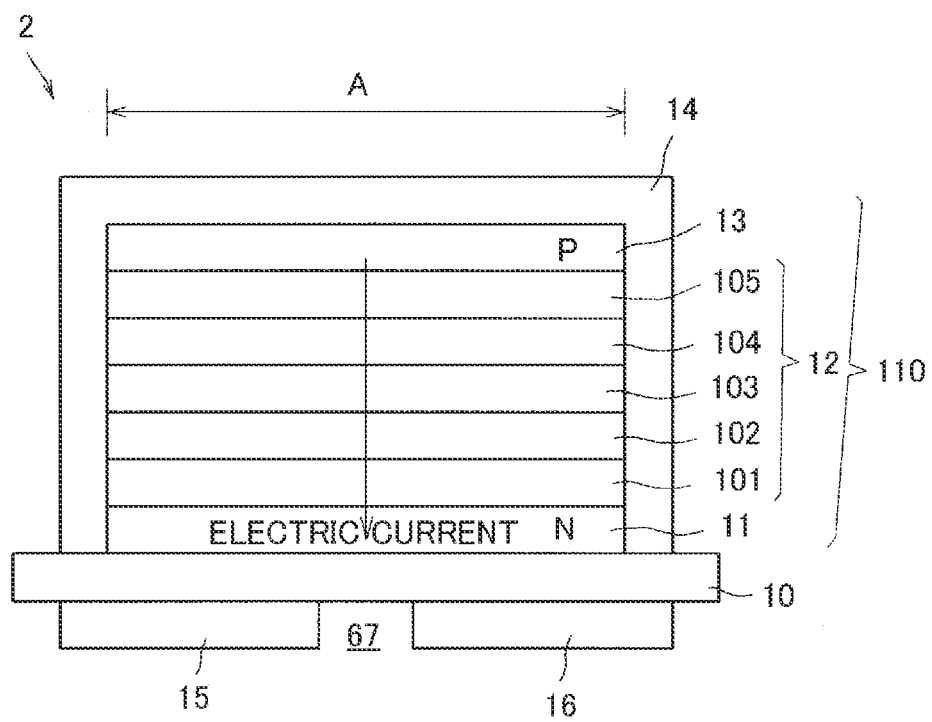
FIG. 2 is a cross section showing a specific layer structure of the organic EL device in FIG. 1.

Herein, the organic light-emitting layer 12 is formed by stacking thin films made of a plurality of organic compounds. FIG. 2 shows a specific layer structure of the organic light-emitting layer 12, which includes a hole injection layer 101, a hole transport layer 102, a light-emitting layer 103, an electron transport layer 104, and an electron injection layer 105.

The organic EL device 2 in the present embodiment has a particular configuration in which electrodes (panel-side conductive members) 15 and 16 are disposed on the other surface of the substrate 10.

Figure 3:
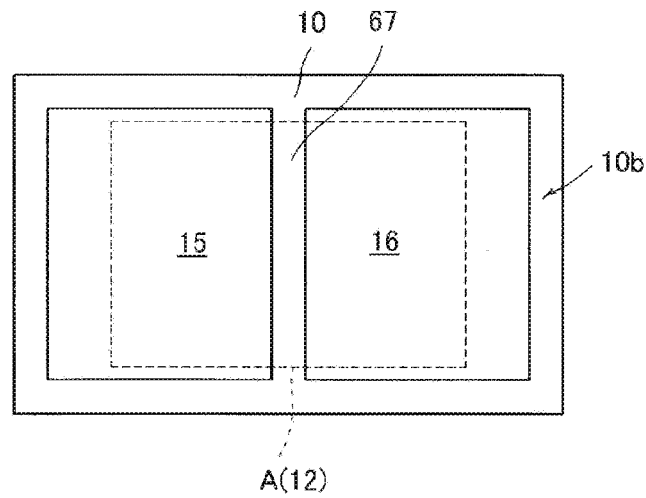
FIG. 3 is a bottom view of the organic EL device in FIG. 1.

Specifically, as shown in FIGS. 1, 2, and 3, the electrodes (panel-side conductive members) 15 and 16 with a planar expanse are stacked on the other surface (a lower face in the drawing) 10b of the substrate 10 near the fixed-side wall surface 7. The electrodes 15 and 16 are located on a lower face (near the substrate) of the organic EL device 2 so as to be overlapped with a light emitting region A in which the organic light-emitting layer 12 is formed. Seeing the organic EL device 2 from a rear face, as shown in FIG. 3, the electrodes (panel-side conductive members) 15 and 16 and the light emitting region A, in which the organic light-emitting layer 12 is formed, are overlapped with each other.

Thus, the electrodes 15 and 16 each occupy a large area on the other surface 10b of the substrate 10, thereby roughly dividing the area of the other surface 10b. Between the electrodes 15 and 16 is formed a gap 67, whereby the electrodes 15 and 16 are electrically insulated from each other.

The fixed-side wall surface 7 serves as a ceiling, a wall, or a floor 6, in which electrodes (wall-side conductive members) 8 and 9 with a planar expanse are embedded, as shown in FIG. 1. The electrodes 8 and 9 are electrically insulated from each other.

A power unit 3 is electrically connected between the electrodes 8 and 9. The power unit 3 can generate an AC current (AC power) and is configured to apply voltage to between the electrodes 8 and 9 so as to supply an electric current.

Herein, an electrical circuit in the luminescent system 1 in the first embodiment of the present invention will be described in detail below, making reference to FIG. 4.

Figure 4:
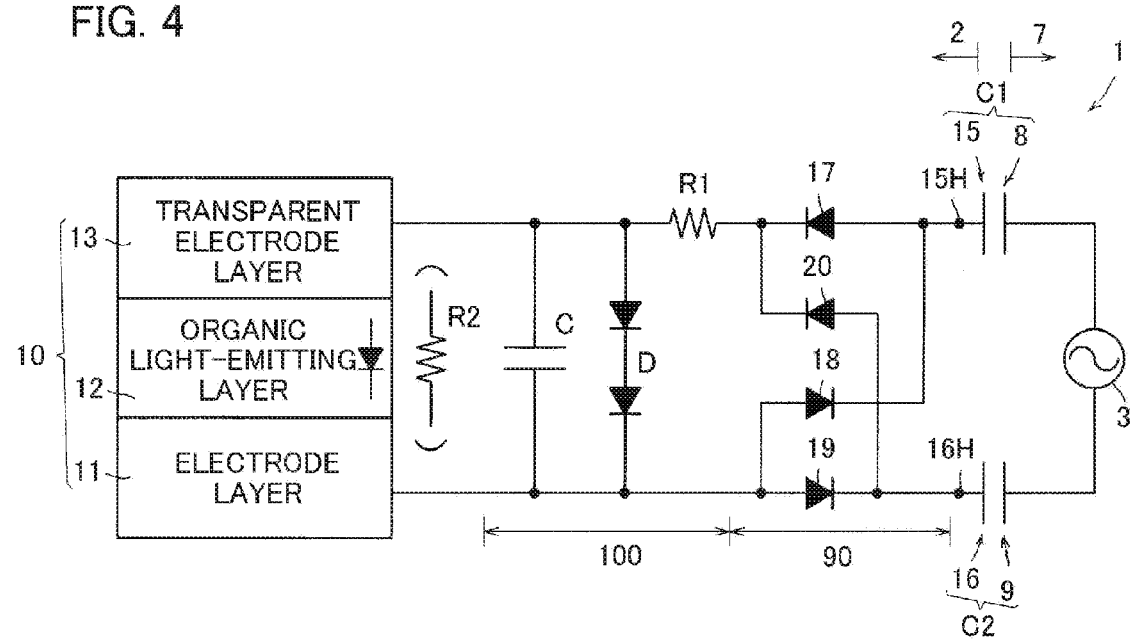
FIG. 4 is an electrical circuit diagram showing the luminescent system in FIG. 1.

Referring to FIG. 4, in the luminescent system 1, the organic EL device 2 and the fixed-side wall surface 7 are connected to each other via capacitances C1 and C2. The capacitance C1 is made up of the electrode 15 of the organic EL device 2 and the electrode 8 of the fixed-side wall surface 7, while the capacitance C2 is made up of the electrode 16 of the organic EL device 2 and the electrode 9 of the fixed-side wall surface 7.

The organic EL device 2 installs a full-wave rectifying circuit 90 and a constant voltage circuit 100. The full-wave rectifying circuit 90 has diodes 17 to 20. The full-wave rectifying circuit 90 is, more specifically, a bridge rectifying circuit.

The diode 17 is connected between the electrode 15 and the transparent electrode layer 13 of the anode side of the organic EL element 110, while the diode 18 is connected between the electrode 15 and the electrode layer 11 of the cathode side of the organic EL element 110. In short, the diode 17 is connected to the transparent electrode layer 13 at its cathode side, whereas the diode 18 is connected to the electrode layer 11 at the anode side.

The diode 19 is connected between the electrode 16 and the electrode layer 11 of the cathode side of the organic EL element 110, while the diode 20 is connected between the electrode 16 and the transparent electrode layer 13 of the anode side of the organic EL element 110. In short, the diode 19 is connected to the electrode layer 11 at its anode side, whereas the diode 20 is connected to the transparent electrode layer 13 at its cathode side.

The full-wave rectifying circuit 90 is configured to rectify an AC current supplied from the fixed-side wall surface 7 to the electrodes 15 and 16, so as to flow the current in only one direction from the transparent electrode layer 13 of the positive electrode (anode) side to the electrode layer 11 of the negative electrode (cathode) side.

The constant voltage circuit 100 employed in this embodiment is a shunt-system constant voltage circuit. The circuit is constituted by a series resistor R1 (1 kΩ or kohm, for example), a diode D to determine an output voltage, and a capacitor C (1 μF or microfarad, for example). In this embodiment, a branch is made between the series resistor R1 and an internal resistor R2 of the organic EL element 110 with the diode D connected to the branch, so that a shunt-system regulator circuit is constituted.

The shunt-system regulator circuit is characterized as having no differential amplifier circuit that is an explicit feedback loop in order to stabilize a voltage. Advantageously, that considerably reduces a circuit scale, so that the shunt-system regulator circuit is achieved even by a circuit element (a thin film element on the organic EL device 2, for example) having difficulty in constructing the differential amplifier circuit. Disadvantageously, that may cause a large power loss in the constant voltage circuit itself in a case of a large consumption of power of the load, resulting in difficulty in stabilization of an output voltage. However, in a case of the organic EL device 2 for lighting and having a large area and a large consumption of power as in this embodiment, it is preferable to constitute the constant voltage circuit 100 by mounting a semiconductor element of a chip shape including a differential amplifier circuit on the organic EL device 2.

Next, an operating state of the luminescent system 1 in the first embodiment of the present invention will be described in detail below, making reference to FIG. 5.

Figure 5:
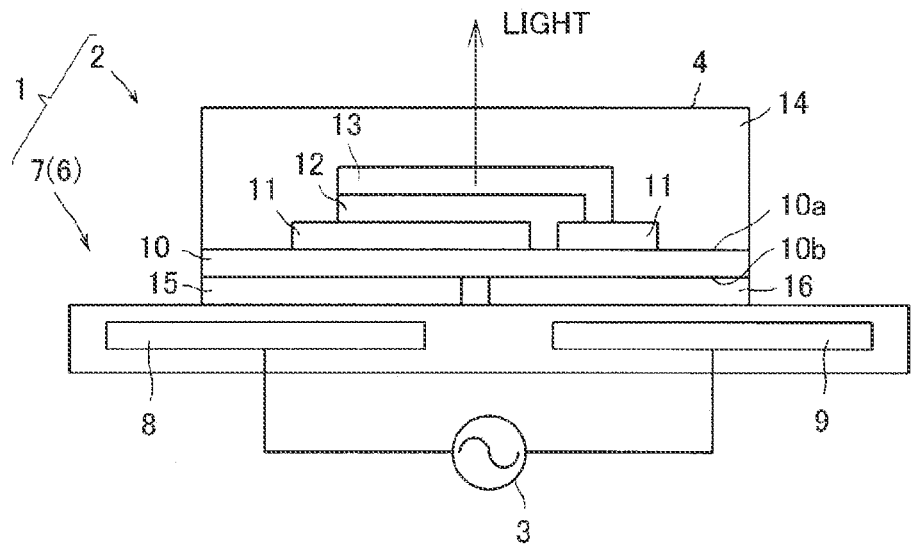
FIG. 5 is a cross section showing an operating state of the luminescent system in FIG. 1.

Referring to FIG. 5, the organic EL device 2 is placed on the fixed-side wall surface 7. In this state, the electrodes 15 and 16 belonging to the organic EL device 2 are arranged so as to be opposite the electrodes 8 and 9 embedded in the fixed-side wall surface 7 with a predetermined interval, respectively. The electrode 15 and the electrode 8 and the electrode 16 and the electrode 9 are arranged so as to be opposite each other across a flooring material not shown, respectively, thereby generating the capacitance between the electrodes.

Specifically, the organic EL device 2 including the electrodes 15 and 16 is electrically connected to the power unit 3 connected to the electrodes 8 and 9 by a capacitive coupling method. As a consequence, an AC current supplied from the power unit 3 flows from the transparent electrode layer 13 of the anode side of the organic EL element 110 to the electrode layer 11 of the cathode side thereof, thereby making the organic light-emitting layer 12 emit light. Then, light is emitted from the upper face 4 of the organic EL device 2.

Herein, a positional relationship of the electrodes in each pair will be described below. The electrode 15 formed in the organic EL device 2 is, as shown in FIG. 5, arranged so as to be opposite the electrode 8 in the fixed-side wall surface 7 across a part of the flooring material. In FIG. 5, the electrode 15 in the organic EL device 2 is mostly located at a position overlapping the electrode 8 in the fixed-side wall surface 7. Similarly, the electrode 16 formed in the organic EL device 2 is mostly located at a position overlapping the electrode 9 in the fixed-side wall surface 7. As described above, both the electrodes 15 and 16 in the organic EL device 2 occupy a large area on the other surface 10b of the substrate 10, thereby roughly dividing the area of the other surface 10b. Specifically, most parts of the electrodes 15 and 16 in the organic EL device 2 respectively overlap the electrodes 8 and 9 in the fixed-side wall surface 7, so that a desired amount of electric power is obtained from the power unit 3. Thus, the organic EL device 2 can assure sufficient luminance and quantity of emitted light.

Figure 6:
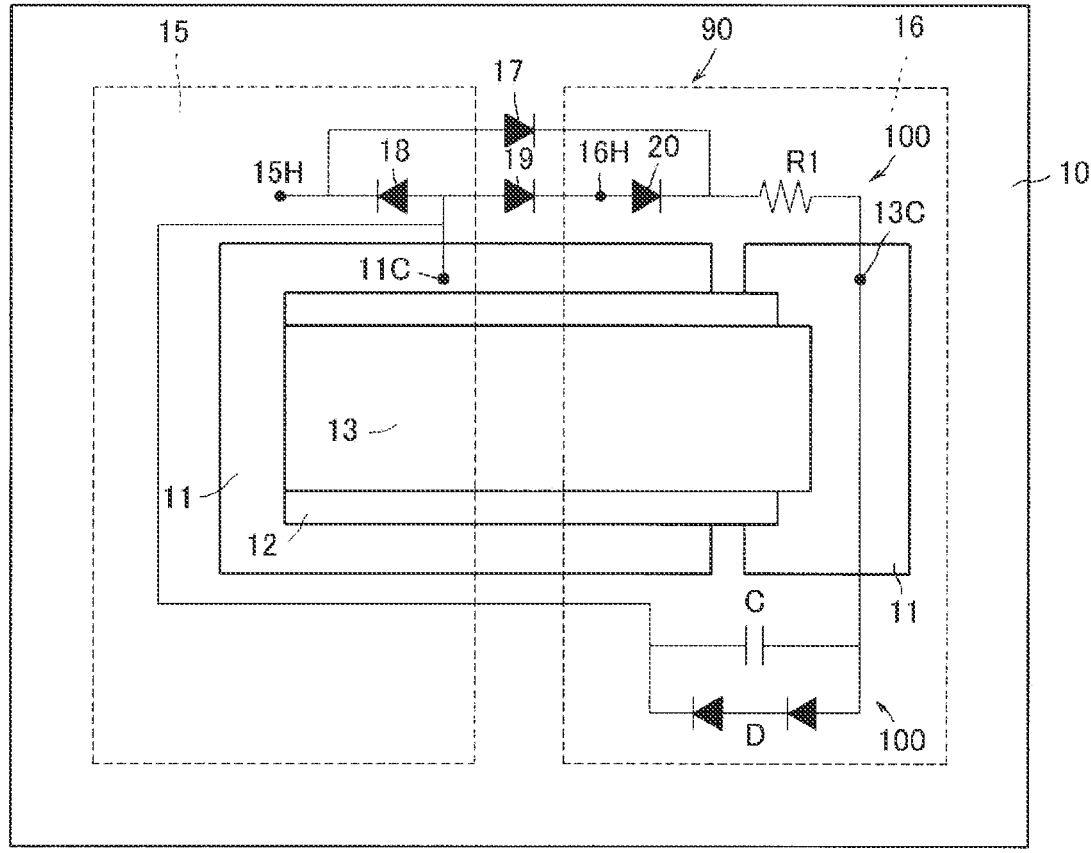
FIG. 6 is a schematic plan view showing a state in which a full-wave rectifying circuit and a constant voltage circuit are connected to the organic EL device.

FIG. 6 is a schematic view of the organic EL device 2 in a planar view, showing a state in which the full-wave rectifying circuit 90 and the constant voltage circuit 100 shown in FIG. 4 are mounted on the substrate 10. Herein, in the organic EL device 2, an entire surface of the front surface 10a of the substrate 10 is sealed by the sealing part 14 (see FIG. 5) after the full-wave rectifying circuit 90 and the constant voltage circuit 100 are mounted on the front surface 10a.

Electron elements in a circuit diagram in FIG. 6 are each an ordinary independent electronic component. Specifically, in the organic EL device 2, the diodes 17 to 20, the series resistor R1, the diode D, and the capacitor C are placed on the substrate 10 and connected to each other thereon, thereby constituting the full-wave rectifying circuit 90 and the constant voltage circuit 100.

FIG. 6 illustrates an example in which the components constituting the full-wave rectifying circuit 90 are disposed on the substrate (substrate 10) in the organic EL device 2.

As shown in FIG. 6, the full-wave rectifying circuit 90 is connected to the electrodes 15 and 16 via throughholes 15H and 16H. Herein, the throughholes 15H and 16H are foil-like conductors connected to the electrodes 15 and 16, respectively, and formed within holes formed in the substrate 10.

Further, the full-wave rectifying circuit 90 is connected to the electrode layers 11 of the cathode sides of the organic EL element 110 via a contact part 11C. Herein, the contact part 11C is a contact disposed on the electrode layer 11 of the cathode side of the organic EL element 110. Further, a part of the full-wave rectifying circuit 90 is connected to a contact part 13C via the series resistor R1, constituting the constant voltage circuit 100. The contact part 13C is a contact disposed on the transparent electrode layer 13 of the anode side of the organic EL element 110.

In contrast, the capacitor C and the series diode D constituting the constant voltage circuit 100 are connected to the electrode layer 11 of the cathode side of the organic EL element 110 via the contact part 11C and to the transparent electrode layer 13 of the anode side thereof via the contact part 13C. More precisely, the capacitor C and the series diode D are indirectly connected to the transparent electrode layer 13 through the electrode layer 11.

Specifically, the full-wave rectifying circuit 90 and the constant voltage circuit 100 described above and shown in FIG. 4 are built on the one surface of the substrate 10 as shown in FIG. 6, so as to be connected to the electrode layer 11 of the cathode side of the organic EL element 110 and the transparent electrode layer 13 of the anode side thereof. Further, the full-wave rectifying circuit 90 and the constant voltage circuit 100 are also connected to the electrodes (panel-side conductive members) 15 and 16 formed on the other surface of the substrate 10.

Hence, in the organic EL device 2, electric power applied to the electrodes 15 and 16 is applied between the transparent electrode layer 13 and the electrode layer 11 through the throughholes 15H and 16H and via the diodes 17 to 20 of the full-wave rectifying circuit 90 and the constant voltage circuit 100.

Herein, in the organic EL device 2, the full-wave rectifying circuit 90 and the constant voltage circuit 100 preferably use throughholes and are entirely sealed after the mounting operation in view of improvement in reliability and in appearance. However, the present invention is not limited thereto. The full-wave rectifying circuit 90 and the constant voltage circuit 100 may be mounted on the other surface 10b of the substrate 10 or on an outer periphery of the substrate 10, for example, and alternatively, on the organic EL device 2 after the sealing operation.

Figure 7:
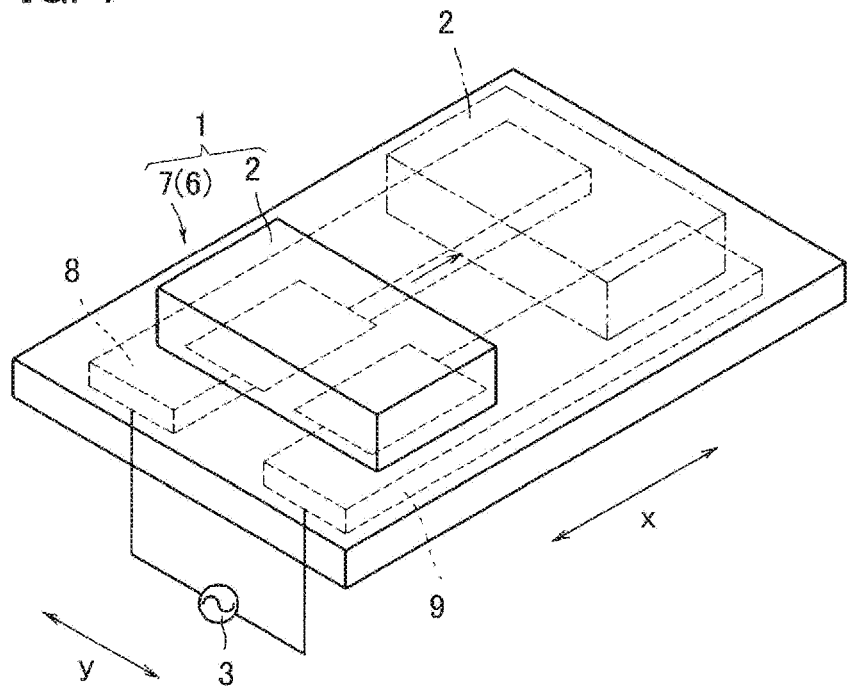
FIG. 7 is a perspective view showing a state in which the organic EL device is moved on a power supply device in the luminescent system in FIG. 1.

Further, though having only contact with the fixed-side wall surface 7 and not being physically connected thereto, the organic EL device 2 emits light upon indirect power supply from the power unit 3. Therefore, as shown in FIG. 7, the organic EL device 2 can move on the fixed-side wall surface 7 while emitting light. However, since the capacitance is required between the organic EL device 2 and the fixed-side wall surface 7, the electrodes 15 and 16 belonging to the organic EL device 2 and the electrodes 8 and 9 embedded in the fixed-side wall surface 7 are arranged so as to be opposite each other, respectively. Thus, the organic EL device 2 has a high positional flexibility in a longitudinal direction X of the fixed-side wall surface 7, but has a limited positional flexibility in a short direction thereof.

The luminescent system 1 in the above-mentioned first embodiment employs the organic EL device 2 of a top emission type, but the present invention is not limited thereto.

Figure 8:
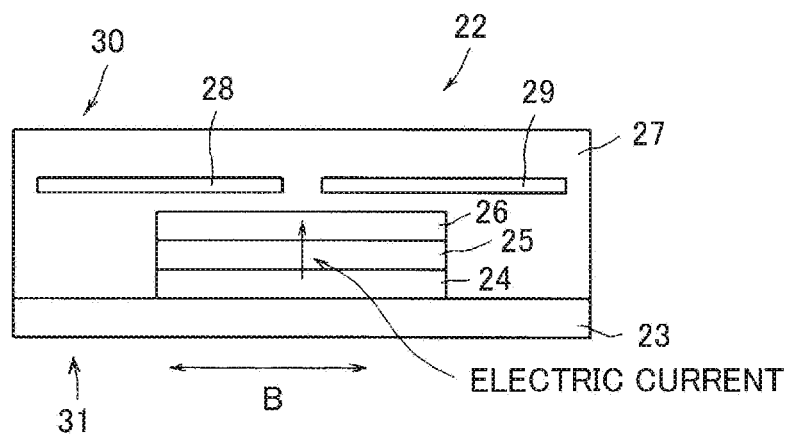
FIG. 8 is a cross section showing an organic EL device used in a luminescent system relating to a second embodiment of the present invention.
Figure 9:
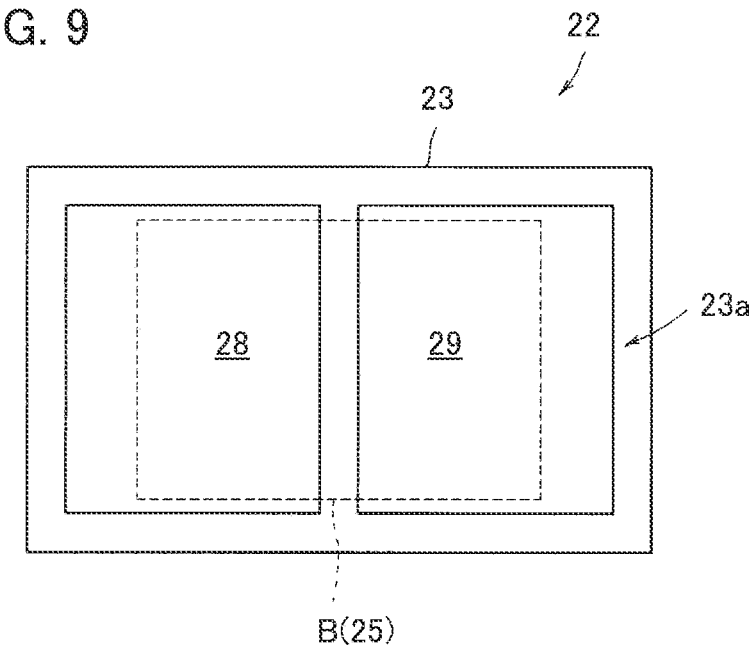
FIG. 9 is a plan view of the organic EL device in FIG. 10.
Figure 10:
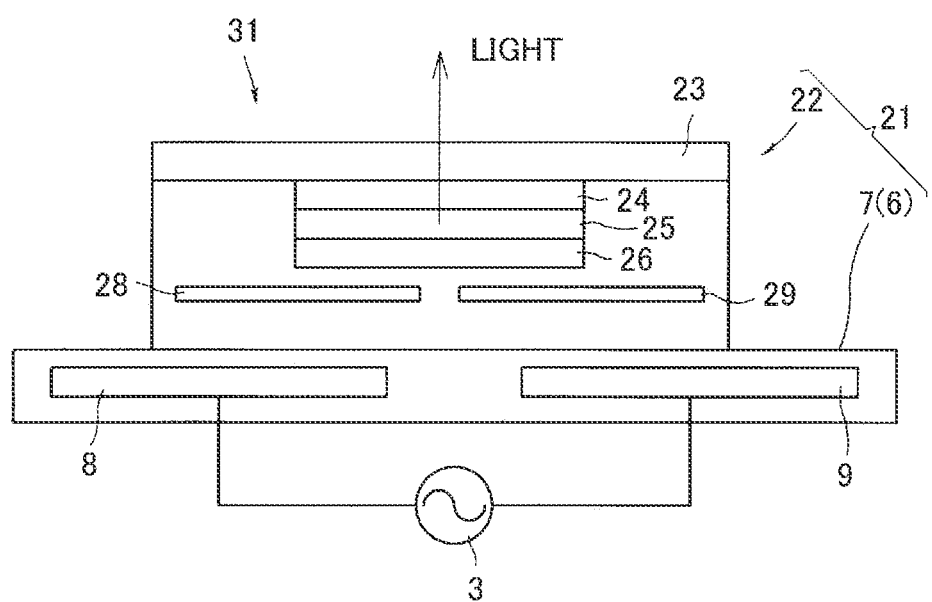
FIG. 10 is a cross section showing an operating state of the luminescent system relating to the second embodiment.

In a luminescent system 21 in a second embodiment shown in FIGS. 8, 9, and 10, the present invention is applied to an organic EL device 22 of a bottom emission type. Herein, the same configurations as those used in the luminescent system 1 in the first embodiment have the same numerals and the description is omitted.

Referring to FIG. 8, the organic EL device 22 is made up of a transparent electrode layer 24 of a positive electrode (anode) side, an organic light-emitting layer 25 referred also to as a functional layer, and an electrode layer 26 of a negative electrode (cathode) side, which are stacked on one surface 23a of a glass substrate 23 with a planar expanse and sealed by a sealing part 27. An arrow in FIG. 8 indicates a flow of electric current. The organic EL device 22 can be simply described as follows. The organic EL device 22 applies a voltage between the transparent electrode layer 24 and the electrode layer 26, so as to make the organic light-emitting layer 25 emit light and to extract light from the glass substrate 23 via the transparent electrode layer 24. The organic EL device 22, which has a configuration of a so-called bottom emission type, has a lower face (near the substrate) 31 of the figure which serves as a light-emitting face.

Referring to FIGS. 8 and 9, electrodes (panel-side conductive members) 28 and 29 are stacked over the electrode layer 26 of the cathode side of the organic EL element 110 with a gap between the electrode layer 26. The electrodes 28 and 29 are located near a face 30 opposite the glass substrate 23 of the organic EL device 22 so as to overlap with a region B overlapping the organic light-emitting layer 25.

The electrodes 28 and 29 each occupy a large area on the face 23a of the glass substrate 23, thereby roughly dividing the area of the face 23a. Between the electrodes 28 and 29 is formed a gap, whereby the electrodes 28 and 29 are electrically insulated from each other. FIG. 9 shows the electrodes 28 and 29 exposed from the sealing part 27 for convenience of explanation. Herein, the electrodes 28 and 29 are not only mere electrodes but also serve as sealing members or equalizing members.

Figure 11:
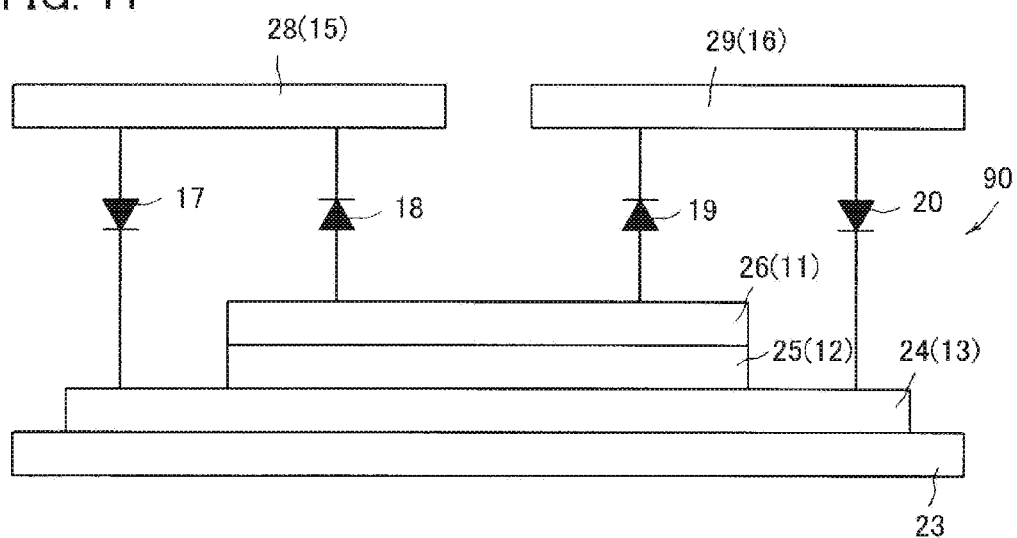
FIG. 11 is a cross-sectional schematic view showing a state in which a full-wave rectifying circuit is connected to the organic EL device in FIG. 10.

Further, as shown in the cross-sectional schematic view in FIG. 11, the organic EL device 22 includes the full-wave rectifying circuit 90 constituted by the diodes 17 to 20 as well as the organic EL device 2 described above. Also in the organic EL device 22, an AC current supplied from the fixed-side wall surface 7 is rectified so as to be used.

Herein, the diodes 17 to 20 constituting the full-wave rectifying circuit 90 may be formed by using the organic light-emitting layer 25 as a rectifier element.

Specifically, the organic light-emitting layer 12 constituting the organic EL element 110 has a pn junction and serves for rectification. More specifically, the organic light-emitting layer 12 flows electric current only from the transparent electrode layer 24 of the anode side to the electrode layer 26 of the cathode side. Hence, the rectification action of the organic light-emitting layer 12 can be used so as to construct the full-wave rectifying circuit 90.

The full-wave rectifying circuit 90 described above is preferably formed by using an edge part of the organic EL element 110.

Figure 12:
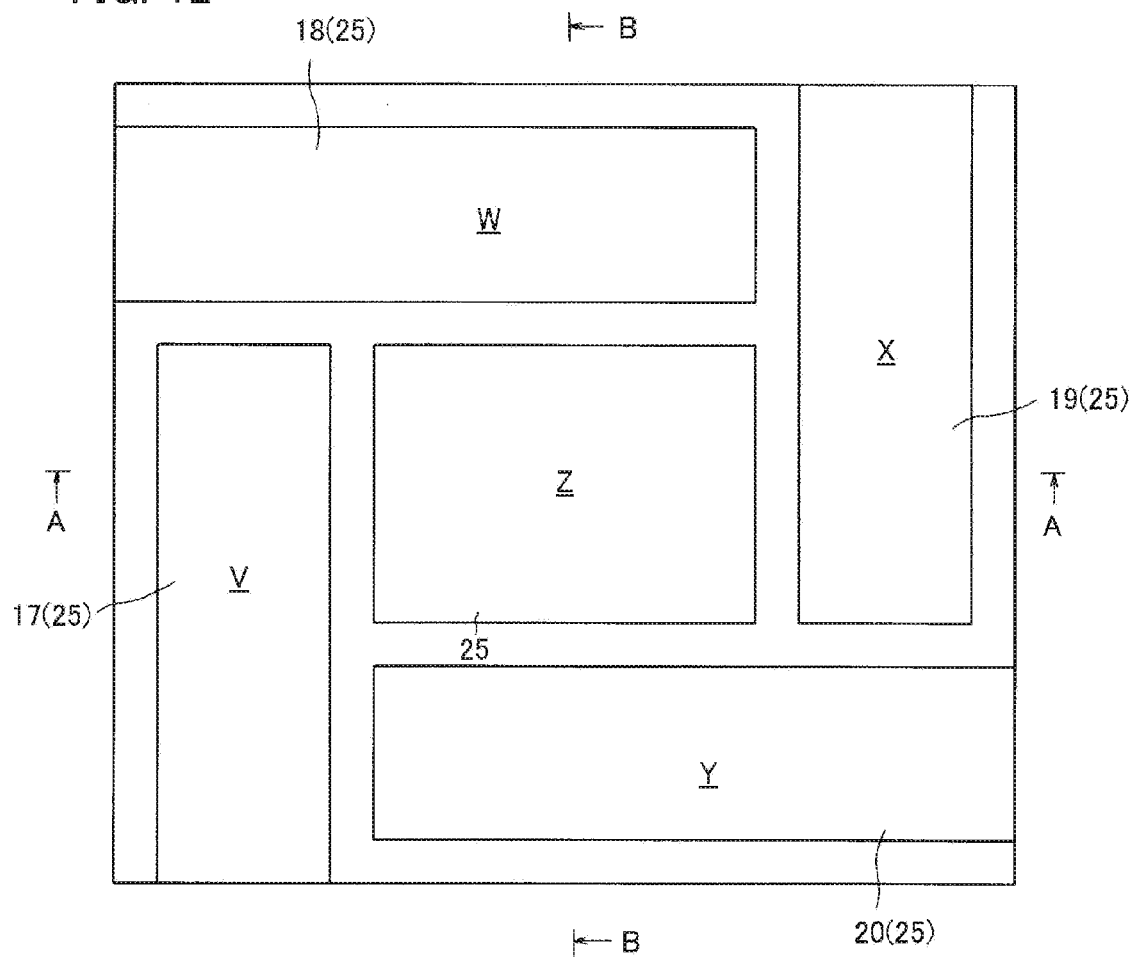
FIG. 12 is a plan view showing a state in which the full-wave rectifying circuit is arranged around the organic EL device.

FIG. 12 illustrates a layout showing the full-wave rectifying circuit 90 formed by using the edge part of the organic EL element 110.

The organic EL device 22 shown in FIG. 12 has a light emitting region Z serving as a main light emitting part in a central part of the substrate 10, which region Z is surrounded with a region V constituting the diode 17, a region X constituting the diode 19, a region W constituting the diode 18, and a region Y constituting the diode 20.

In sum, in the organic EL device 22 shown in FIG. 12, the light emitting region Z serving as the main light emitting part is arranged in the central part of the substrate of the organic EL device with the regions V, X, W, Y serving as the diode parts formed around the region Z.

Figure 13A:
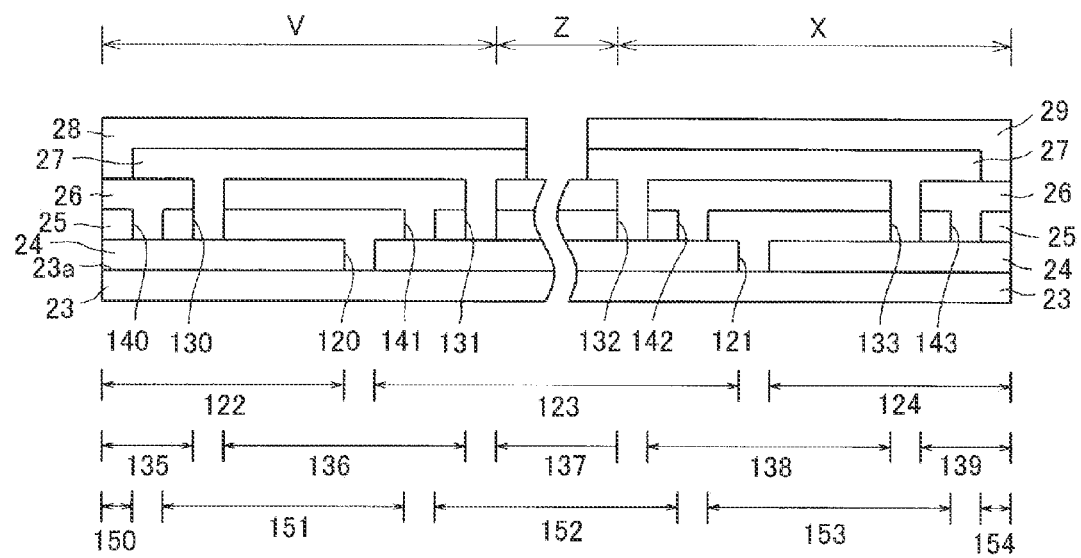
FIGS. 13A and B are cross sections showing a state in which the full-wave rectifying circuit formed in an organic light-emitting layer is arranged adjacent to the organic EL device, FIG. 13A being an explanatory diagram showing each region and FIG. 13B being an explanatory diagram showing a flow of electric current in FIG. 13A.
Figure 13B:
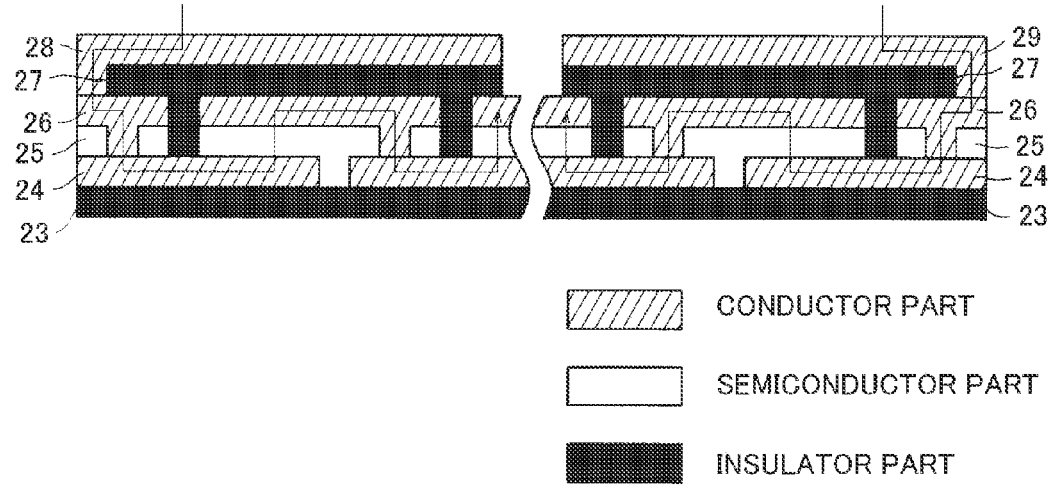

FIGS. 13A and B are enlarged cross sections of the edge part in the cross section taken along a line A-A of the substrate 10 shown in FIG. 12, FIG. 13A showing a stacked state of the layers and FIG. 13B showing a conductor part, a semiconductor part, and insulator part drawn in different ways, and a flow of electric current.

As described above, the organic EL device 22 shown in FIG. 13 is formed by stacking the transparent electrode layer 24 of the positive electrode (anode) side, the organic light-emitting layer 25 serving for rectification, and the electrode layer 26 of the negative electrode (cathode) side on the one surface 23a of the glass substrate 23 and sealing the layers by the sealing part 27. Furthermore, the electrodes (panel-side conductive members) 28 and 29 are stacked on the sealing part 27.

Herein, the electrodes 28 and 29 are electrodes with a planar expanse in a substantially "L" shape. Specifically, the electrode 28 is stacked over the region V and the region Y, while the electrode 29 is stacked over the region X and the region W.

In the organic EL device 22 shown in FIG. 13, the layers each have a plurality of grooves, whereby the layers each are divided into a plurality of areas and via which an upper and a lower layer are connected.

Specifically, in the organic EL device 22 shown in FIG. 13, the transparent electrode layer 24 has a first groove 120 and a second groove 121 from a left side of the figure, whereby the transparent electrode layer 24 is divided into a first area 122, a second area 123, and a third area 124.

The first groove 120 and the second groove 121 formed in the transparent electrode layer 24 divide and insulate the transparent electrode layer 24, corresponding to electrode layer dividing parts.

Further, four communication grooves 130, 131, 132, and 133 are formed so as to communicate the organic light-emitting layer 25 with the electrode layer 26 of the cathode side.

The sealing part 27 of the insulator penetrates into the communication grooves 130, 131, 132, and 133. That divides the organic light-emitting layer 25 and the electrode layer 26 of the cathode side into a first area 135, a second area 136, a third area 137, a fourth area 138, and a fifth area 139.

The communication grooves 130, 131, 132, and 133 divide and insulate the electrode layer 26 of the cathode side, corresponding to electrode layer dividing parts.

Furthermore, the organic light-emitting layer 25 separately has a first groove 140, a second groove 141, a third groove 142, and a fourth groove 143. The electrode layer 26 of the cathode side located at an upper-layer side in the figure penetrates the above-mentioned grooves 140, 141, 142, and 143, so that the electrode layer 26 and the transparent electrode layer 24 are electrically connected to each other through the organic light-emitting layer 25.

Thus, the organic light-emitting layer 25 is divided into a first area 150, a second area 151, a third area 152, a fourth area 153, and a fifth area 154.

Herein, the first groove 140, the second groove 141, the third groove 142, and the fourth groove 143 formed in the organic light-emitting layer 25 correspond to organic light-emitting layer dividing parts that divide the organic light-emitting layer 25. The electrode layer 26 penetrates the organic light-emitting layer dividing parts, so that the electrode layer 26 located within the first groove 140, the second groove 141, the third groove 142, and the fourth groove 143 forms conducting parts making the electrode layer 26 and the transparent electrode layer 24 be conductive.

In the organic EL device 22 as shown in FIG. 13, the electrodes (panel-side conductive members) 28 and 29, the transparent electrode layer 24 and the electrode layer 26 are conductors. The sealing part 27 is an insulator. The organic light-emitting layer 25 is a semiconductor having a pn junction and serves for rectification.

Herein, the distribution of the conductor, the insulator, and the semiconductor of the regions drawn in different ways by hatching taking a look at both ends of the organic EL device 22 is shown in FIG. 13B.

Specifically, the electrode (panel-side conductive member) 28 is electrically connected to the first area 135 of the electrode layer 26 of the cathode side located below at a left end part in the figure and is further electrically connected to the first area 122 of the transparent electrode layer 24 located further below via the first groove 140.

Therefore, the electrode (panel-side conductive member) 28 is electrically connected to the first area 122 of the transparent electrode layer 24 that is a conductor.

Further, the second area 151 of the organic light-emitting layer 25 that is a semiconductor is located above the first area 122 of the transparent electrode layer 24, and the second area 136 of the electrode layer 26 is located further above. In other words, the first area 122 of the transparent electrode layer 24 that is a conductor and the second area 136 of the electrode layer 26 that is a conductor are opposite each other across the second area 151 of the organic light-emitting layer 25 that is a semiconductor.

The second area 151 of the organic light-emitting layer 25 is a semiconductor applying electric current only from the transparent electrode layer 24 to the electrode layer 26.

The second area 136 of the electrode layer 26 is further electrically connected to the second area 123 of the transparent electrode layer 24 via the second groove 141 of the organic light-emitting layer 25, so as to be electrically connected to the light emitting region Z.

Consequently, in this embodiment, the semiconductive layer (the second area 151 of the organic light-emitting layer 25) is situated between the electrode (panel-side conductive member) 28 and the transparent electrode layer 24 (second area 123) in the light emitting region Z and allows electric current to be applied only in one direction from the electrode (panel-side conductive member) 28 to the transparent electrode layer 24 (second area 123) in the light emitting region Z.

Consequently, the second area 151 of the organic light-emitting layer 25 serves the same function as that of the above-mentioned diode 17 in FIG. 11.

Similarly, taking a look at a right end part in FIGS. 13A and B, the electrode (panel-side conductive member) 29 is electrically connected to the fifth area 154 of the electrode layer 26 of the cathode side located below at the right end part in the figure and is electrically connected to the third area 124 of the transparent electrode layer 24 located further below via the fourth groove 143.

Therefore, the electrode (panel-side conductive member) 29 is electrically connected to the third area 124 of the transparent electrode layer 24 that is a conductor.

Further, the fifth area 154 of the organic light-emitting layer 25 that is a semiconductor is located above the third area 124 of the transparent electrode layer 24, and the fourth area 138 of the electrode layer 26 is located further above. In other words, the third area 124 of the transparent electrode layer 24 that is a conductor and the fourth area 138 of the electrode layer 26 that is a conductor are opposite each other across the fifth area 154 of the organic light-emitting layer 25 that is a semiconductor.

The fifth area 154 of the organic light-emitting layer 25 is a semiconductor applying electric current only from the transparent electrode layer 24 to the electrode layer 26.

The fourth area 138 of the electrode layer 26 is electrically connected to the second area 123 of the transparent electrode layer 24 via the third groove 142 of the organic light-emitting layer 25, so as to be electrically connected to the light emitting region Z Consequently, in this embodiment, the semiconductive layer (the fifth area 154 of the organic light-emitting layer 25) is situated between the electrode (panel-side conductive member) 29 and the transparent electrode layer 24 (second area 123) in the light emitting region Z and allows electric current to be applied only in one direction from the electrode (panel-side conductive member) 28 to the transparent electrode layer 24 (second area 123) in the light emitting region Z.

Consequently, the fifth area 154 of the organic light-emitting layer 25 serves the same function as that of the above-mentioned diode 20 in FIG. 11.

Figure 14A:
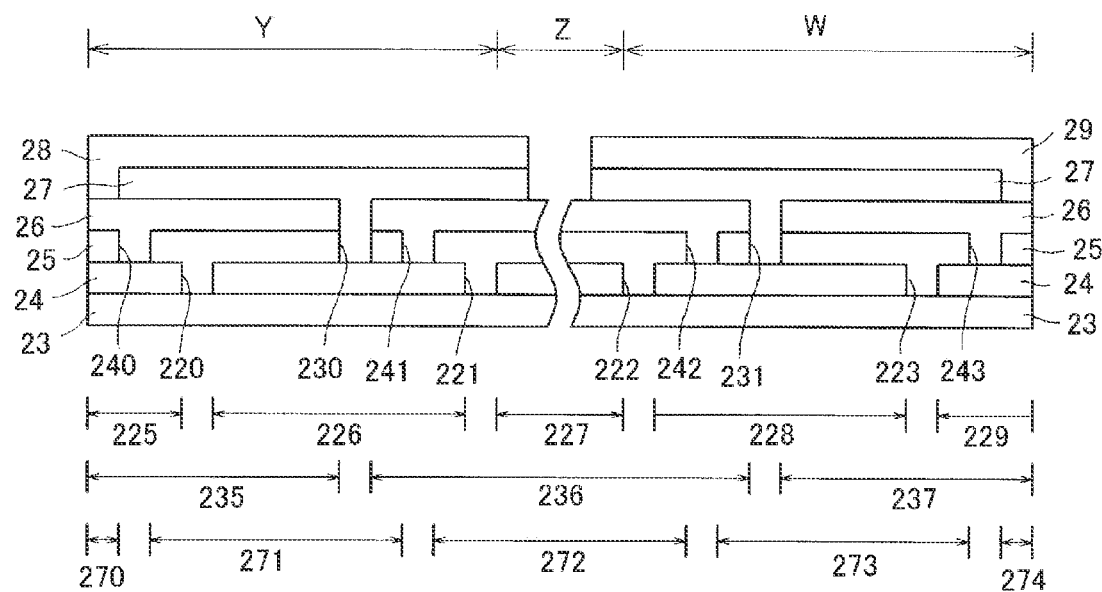
FIGS. 14A and B are cross sections showing a state in which the full-wave rectifying circuit formed in the organic light-emitting layer is arranged adjacent to the organic EL device, FIG. 14A being an explanatory diagram showing each region and FIG. 14B being an explanatory diagram showing a flow of electric current in FIG. 14A.
Figure 14B:
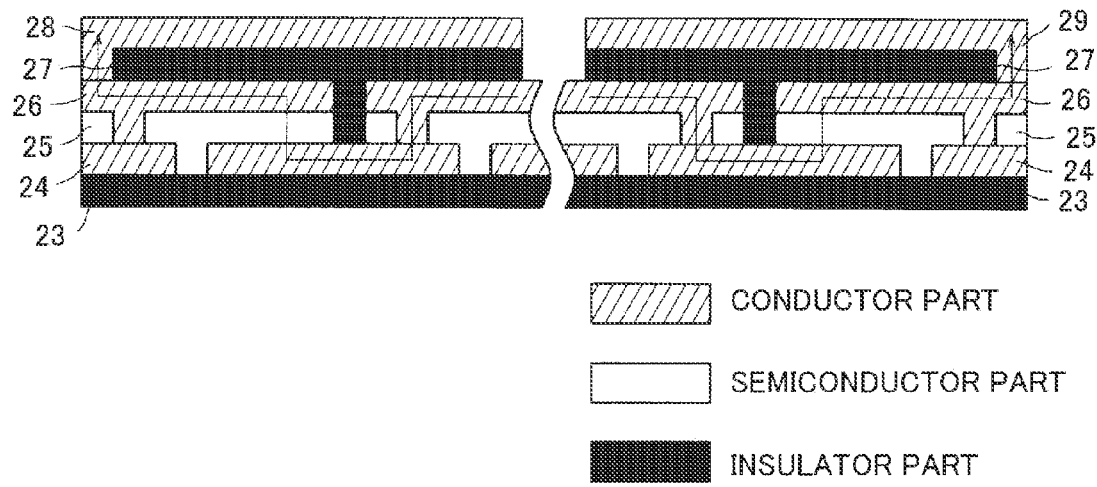

FIGS. 14A and B are enlarged cross sections of the edge part of the cross section taken along a line B-B of the substrate 10 shown in FIG. 12, FIG. 14A showing a stacked state of the layers and FIG. 14B showing a conductor part, a semiconductor part, and insulator part drawn in different ways, and a flow of electric current.

Also in a case of observing the substrate 10 cut at the B-B line, as shown in FIGS. 14A and B, the layers each have a plurality of grooves, whereby the layers each are divided into a plurality of parts and via which an upper and a lower layer are connected.

Specifically, the transparent electrode layer 24 has a first groove 220, a second groove 221, a third groove 222, and a fourth groove 223 from a left side of the figure, whereby the transparent electrode layer 24 is divided into a first area 225, a second area 226, a third area 227, a fourth area 228, and a fifth area 229.

Further, two communication grooves 230 and 231 are formed so as to communicate the organic light-emitting layer 25 with the electrode layer 26 of the cathode side.

The sealing part 27 of the insulator penetrates into the communication grooves 230 and 231. That divides the organic light-emitting layer 25 and the electrode layer 26 of the cathode side into a first area 235, a second area 236, and a third area 237.

Furthermore, the organic light-emitting layer 25 separately has a first groove 240, a second groove 241, a third groove 242, and a fourth groove 243. The electrode layer 26 of the cathode side located at an upper-layer side in the figure penetrates the above-mentioned grooves 240, 241, 242, and 243, so that the electrode layer 26 and the transparent electrode layer 24 are electrically connected to each other through the organic light-emitting layer 25.
The organic light-emitting layer 25 is divided into five areas from a first area 270 to a fifth area 274 by the above-mentioned grooves.

As described above, in the organic EL device 22 as shown in FIG. 14, the electrodes (panel-side conductive members) 28 and 29, the transparent electrode layer 24, and the electrode layer 26 are conductors. The sealing part 27 is an insulator. The organic light-emitting layer 25 is a semiconductor and serves for rectification.

Herein, the distribution of the conductor, the insulator, and the semiconductor of the regions drawn in different ways by hatching taking a look at both ends (parts Y and W) of the organic EL device 22 is shown in FIG. 14B.

Specifically, the electrode (panel-side conductive member) 28 is electrically connected to the first area 235 of the electrode layer 26 of the cathode side located below at a left end part in the figure.

The second area 271 of the organic light-emitting layer 25 that is a semiconductor layer is located below the first area 235 of the electrode layer 26, and the second area 226 of the transparent electrode layer 24 is located further below.

In other words, the second area 226 of the transparent electrode layer 24 that is a conductor and the first area 235 of the electrode layer 26 that is a conductor are opposite each other across the second area 271 of the organic light-emitting layer 25 that is a semiconductor.

The second area 271 of the organic light-emitting layer 25 is a semiconductor applying electric current only from the transparent electrode layer 24 to the electrode layer 26.

The second area 226 of the transparent electrode layer 24 is further electrically connected to the second area 236 of the electrode layer 26 via the second groove 241 of the organic light-emitting layer 25, so as to be electrically connected to the light emitting region Z.

Consequently, in this embodiment, the semiconductive layer (the second area 271 of the organic light-emitting layer 25) is situated between the electrode (panel-side conductive member) 28 and the electrode layer 26 (second area 236) in the light emitting region Z and allows electric current to be applied only in one direction from the transparent electrode layer 24 (second area 226) in the light emitting region Z to the electrode (panel-side conductive member) 28.

Consequently, the second area 271 of the organic light-emitting layer 25 serves the same function as that of the above-mentioned diode 18 in FIG. 11.

Similarly, taking a look at a right end part in FIGS. 14A and B, the electrode (panel-side conductive member) 29 is electrically connected to the third area 237 of the electrode layer 26 of the cathode side located below at the right end part in the figure.

Further, the fifth area 274 of the organic light-emitting layer 25 that is a semiconductor layer is located below the third area 237 of the electrode layer 26, and the fourth area 228 of the transparent electrode layer 24 is located further below.

In other words, the fourth area 228 of the transparent electrode layer 24 that is a conductor and the third area 237 of the electrode layer 26 that is a conductor are opposite each other across the fifth area 274 of the organic light-emitting layer 25 that is a semiconductor.

The fifth area 274 of the organic light-emitting layer 25 is a semiconductor applying electric current only from the transparent electrode layer 24 to the electrode layer 26.

The fourth area 228 of the transparent electrode layer 24 is electrically connected to the second area 236 of the electrode layer 26 via the third groove 242 of the organic light-emitting layer 25, so as to be electrically connected to the light emitting region Z.

Consequently, in this embodiment, the semiconductive layer (the fourth area 273 of the organic light-emitting layer 25) is situated between the electrode (panel-side conductive member) 28 and the electrode layer 26 (second area 236) in the light emitting region Z and allows electric current to be applied only in one direction from the transparent electrode layer 24 (fourth area 228) in the light emitting region Z to the electrode (panel-side conductive member) 29.

Consequently, a sixth area 275 of the organic light-emitting layer 25 serves the same function as that of the above-mentioned diode 19 in FIG. 11.

In this way, the diodes 17 and 20 each have a structure as shown in FIGS. 13A and B. Similarly, the diodes 18 and 19 each have a structure as shown in FIGS. 14A and B.

These relationships can be more simply expressed as follows. In this embodiment, in the region V, the first groove 120 formed in the transparent electrode layer 24 constitutes the electrode layer dividing part. The first area 122 and the second area 123, which are the two adjacent regions of the transparent electrode layer 24 with the electrode layer dividing part as the boundary, are electrically connected to each other via the second area 136, which is a part of the organic light-emitting layer, and the second groove 141, which is the conducting part, thereby constituting the diode forming part.

In the region V, though relationships seen from the electrode layer 26 side are the same as described above, the first groove 140 formed in the electrode layer 26 constitutes the electrode layer dividing part. The first area 135 and the second area 136, which are the two adjacent regions of the electrode layer 26 with the electrode layer dividing part as the boundary, are electrically connected to each other via the second area 136, which is a part of the organic light-emitting layer, and the first groove 140, which is the conducting part, thereby constituting the diode forming part.

These relationships are applied in the other regions X, W, and Y.

As shown in FIG. 12 described above, the full-wave rectifying circuit 90 constituted by the diodes 17 to 20 can be arranged around the main light emitting region Z (the organic light-emitting layer 25 usually emitting light) in the organic EL device 22.

In this way, since all the diodes 17 to 20, which are constituent elements of the full-wave rectifying circuit 90, are formed by using the organic light-emitting layer 25 having a pn junction, it is not necessary to mount, for example, a chip diode that is a surface mount component. Hence, the organic EL device 22 can be thinner.

Herein, the diodes 17 to 20 constituting the full-wave rectifying circuit 90 each serves as a reverse blocking diode and become a region contributing to light emission when a power voltage is applied in a forward direction. Thus, in the organic EL device 22, it is preferable to make an area of each of the regions V to Y constituting the diodes 17 to 20 be nearly the same as that of the main light emitting region Z (the organic light-emitting layer 25 usually emitting light, the main light emitting part) located in the center, as shown in FIG. 12.

Further, in the organic EL device 22, color tones in the regions V and W (diodes 17 and 18) emitting light in only a forward direction and in the regions X and Y (diodes 19 and 20) emitting light in only a reverse direction are allocated to a short wavelength side and a long wavelength side relative to the main light emitting region Z, so as to be controllable by alternating current waveform. Specifically, it is preferable that the main light emitting region Z located in the center emit light in white and the regions V to Y each emitting light in only forward or reverse directions emit light in bluish white or reddish white, respectively. In this way, it is preferable that the main light emitting region Z and the regions V to Y each emitting light in only forward or reverse directions be divided into small units, so-called cells, which are transversely or vertically connected in series. In the organic EL device 22 that is a device formed by cells connected in series, a commercial power supply such as AC 100V can be applied, for example.

Next, an operating state of the luminescent system 21 in the second embodiment of the present invention will be described in detail below, making reference to FIG. 10.

Referring to FIG. 10, the organic EL device 22 is placed on the fixed-side wall surface 7 with the glass substrate 23 facing upward. In the luminescent system 21, the organic EL device 22 is arranged so that the upside is turned down unlike the luminescent system 1 shown in FIG. 5. In this state, the electrodes 28 and 29 in the organic EL device 22 are opposite the electrodes 8 and 9 embedded in the fixed-side wall surface 7 with a predetermined interval, respectively. The electrode 28 of the organic EL device 22 and the electrode 8 of the fixed-side wall surface 7 and the electrode 29 of the organic EL device 22 and the electrode 9 of the fixed-side wall surface 7 are arranged so as to be opposite each other across the sealing part 27 and a part of a flooring material, respectively, thereby generating the capacitance between the electrodes.

Specifically, the organic EL device 22 including the electrodes 28 and 29 is electrically connected to the power unit 3 connected to the electrodes 8 and 9 by a capacitive coupling method. As a consequence, an AC current supplied from the power unit 3 flows from the transparent electrode layer 24 to the electrode layer 26, so that light is emitted from the glass substrate 23 of the organic EL device 22.

Referring to FIG. 10, the electrode 28 in the organic EL device 22 is mostly located at a position overlapping the electrode 8 in the fixed-side wall surface 7. Similarly, the electrode 29 in the organic EL device 22 is mostly located at a position overlapping the electrode 9 in the fixed-side wall surface 7. As described above, both the electrodes 28 and 29 in the organic EL device 22 occupy a large area of the surface 23a of the glass substrate 23, so as to roughly divide the area of the surface 23a. Specifically, most parts of the electrodes 28 and 29 overlap the electrodes 8 and 9 in the fixed-side wall surface 7, thereby supplying a desired amount of electric power from the power unit 3 to the organic EL device 22 also in the luminescent system 21 in the second embodiment, as well as in the luminescent system 1 in the first embodiment. Thus, the organic EL device 22 can assure sufficient luminance and quantity of emitted light.

The luminescent system 1 in the first embodiment and the luminescent system 21 in the second embodiment described above illustrate examples in which the organic EL device 2, 22 has the electrodes (panel-side conductive members) 15 and 16 and the electrodes (panel-side conductive members) 28 and 29. Specifically, in the first embodiment, the organic EL device 2 has the two-layered electrodes (panel-side conductive members) 15 and 16. Similarly, in the second embodiment, the organic EL device 22 also has the two-layered electrodes (panel-side conductive member) 28 and 29. In this way, the first and second embodiments described above each have two panel-side conductive members, but can supply power only with one panel-side conductive member.

Specifically, the employment of an electrical energy transmitting device disclosed in Patent document 2 (JP 2009-531009 A) specified above enables supplying power to the organic light-emitting layer 12 with one panel-side conductive member so as to emit light.

Figure 15:
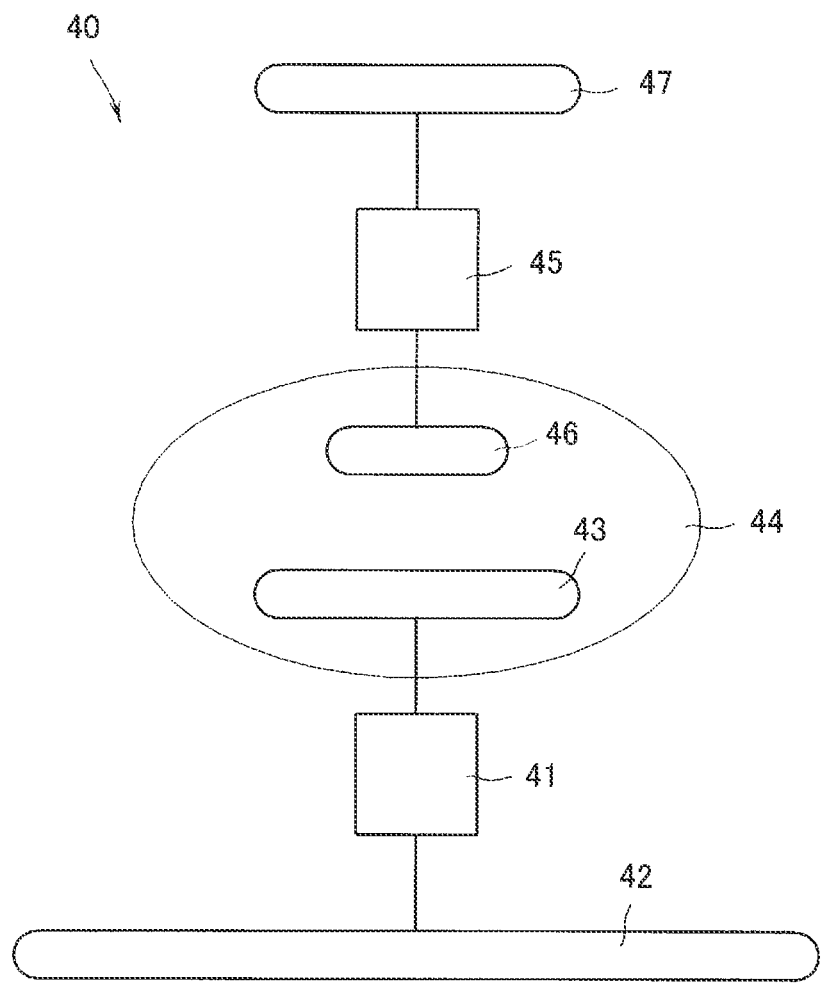
FIG. 15 is an operating principle diagram of an electrical energy transmitting device disclosed in Patent document 2.

FIG. 15 is an operating principle diagram of an electrical energy transmitting device 40 disclosed in Patent document 2.

The electrical energy transmitting device 40 includes a high-tension, high-frequency generator (HTHF generator) 41 located between a passive electrode 42 and an active electrode 43 and a high impedance load 45 located between an electrode (electromotive electrode) 46 and an electrode (passive electrode) 47.

The high-tension, high-frequency generator 41 is an energy generating apparatus, while the high impedance load 45 is an energy consumption apparatus. The high-tension, high-frequency generator 41 and the high impedance load 45 are arranged so that the active electrode 43 and the electrodes 46 face each other. There is a coupling capacitor between the active electrode 43 and the electrodes 46, between which a potential is generated. As a consequence, a strong electric field zone 44 in which energy is concentrated is generated in a space where the active electrode 43 and the electrode 46 are located, so that an electrical energy is transmitted from the high-tension, high-frequency generator 41 to the high impedance load 45.

The passive electrode 42 is a large electrode and the active electrode 43 is a small electrode. The passive electrode 42 may use a ground cable (reservoir electrode).

Meanwhile, the electrode 46 is a small electrode and the electrode 47 is a large electrode. The electrode 47 is preferably placed in a weak electric field zone.

The electrical energy transmitting device 40 is based on the use of the Coulomb interaction, which is also called an electrical influence, and uses a strong electric field causing rapid temporal variation in order to normally use extremely small Maxwell's displacement current in a dielectric medium located outside a conductor.

Herein, a frequency used in the electrical energy transmitting device 40 is much higher than a frequency normally used for transmission of electrical energy, but remains low enough negligible for electromagnetic radiation.

The electrical energy transmitting device 40 is attributed to take account of an interaction between two asymmetric oscillating electric dipoles. That is why the two electric dipoles interact with each other in a way similar to an interaction obtained between two magnetic self-inductances communicated with each other by an AC current. Consequently, the electrical energy transmitting device 40 is an equivalent of a partial coupling transformer as to the influence. This coupling is performed through a dielectric medium of permittivity instead of an inductive medium of magnetic permeability in a case of a transformer.

Figure 16:
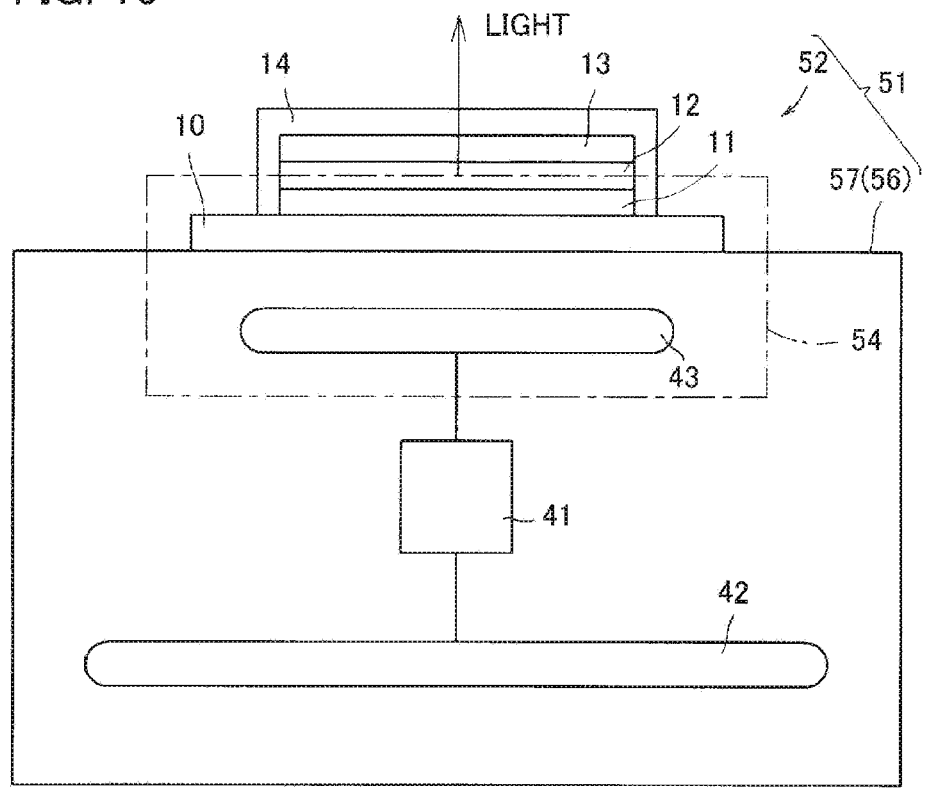
FIG. 16 is a conceptual diagram of a luminescent system relating to a third embodiment, being a cross section of an organic EL device and a power supply device.

FIG. 16 shows a luminescent system 51 of a third embodiment of the present invention adapting the electrical energy transmitting device 40 disclosed in Patent document 2.

Referring to FIG. 16, the luminescent system 51 mainly consists of an organic EL device 52 and a fixed-side wall surface 57. The fixed-side wall surface 57 constitutes a floor 56.

The organic EL device 52 has substantially the same configuration as that of the organic EL device 2 of a top emission type and is made up of the electrode layer 11 of the negative electrode (cathode) side, the organic light-emitting layer 12 referred also to as the functional layer, and the transparent electrode layer 13 of the positive electrode (anode) side, which are stacked on the substrate 10 and sealed by the transparent sealing part 14.

Herein, in this embodiment, the electrode layer 11 of the negative electrode side in the organic EL device 52 serves as the panel-side conductive member.

Further, the organic EL device 52 is provided with a half-wave rectifying circuit, so as to rectify and use an AC current supplied from the fixed-side wall surface 57 (an electrical circuit diagram being abbreviated in the figure).

The high-tension, high-frequency generator (HTHF generator) 41 used in the electrical energy transmitting device 40 is embedded in the fixed-side wall surface 57. At both ends of the high-tension, high-frequency generator 41 are arranged the passive electrode 42 and the active electrode 43.

Next, an operating state of the luminescent system 51 in the third embodiment of the present invention will be described in detail below.

The organic EL device 52 is placed on the fixed-side wall surface 57 with the substrate 10 being a base. In this state, the electrode layer (panel-side conductive member) 11 in the organic EL device 52 is opposite the active electrode 43 embedded in the fixed-side wall surface 7 with a predetermined interval. The active electrode 43 and the electrode layer 11 are arranged so as to be opposite each other across the substrate 10 and a part of the flooring material, thereby generating a capacitance therebetween.

Specifically, there is a coupling capacitor between the active electrode 43 and the electrode layer 11. In this state, upon supply of electrical energy from the high-tension, high-frequency generator 41, a potential is generated between the active electrode 43 and the electrode layer 11, as well as the electrical energy transmitting device 40 disclosed in the Patent document 2.

As a consequence, a strong electric field zone 54 in which energy is concentrated is generated in a space where the active electrode 43 and the electrode layer 11 are located, so that an electrical energy is transmitted from the high-tension, high-frequency generator 41 to the organic EL device 52. Thereby, an upper face of the organic EL device 52 emits light.

As described above, the luminescent system 51 in the third embodiment achieves contactless electric power supply to the organic EL device 52 without the panel-side conductive member by application of the electrical energy transmitting device 40 disclosed in Patent document 2.

The above-mentioned luminescent system 51 in the third embodiment described above illustrates an example in which the organic EL device 52 of a top-emission type is employed, but the present invention is not limited thereto. It is possible to employ an organic EL device of a bottom-emission type.

Figure 17:
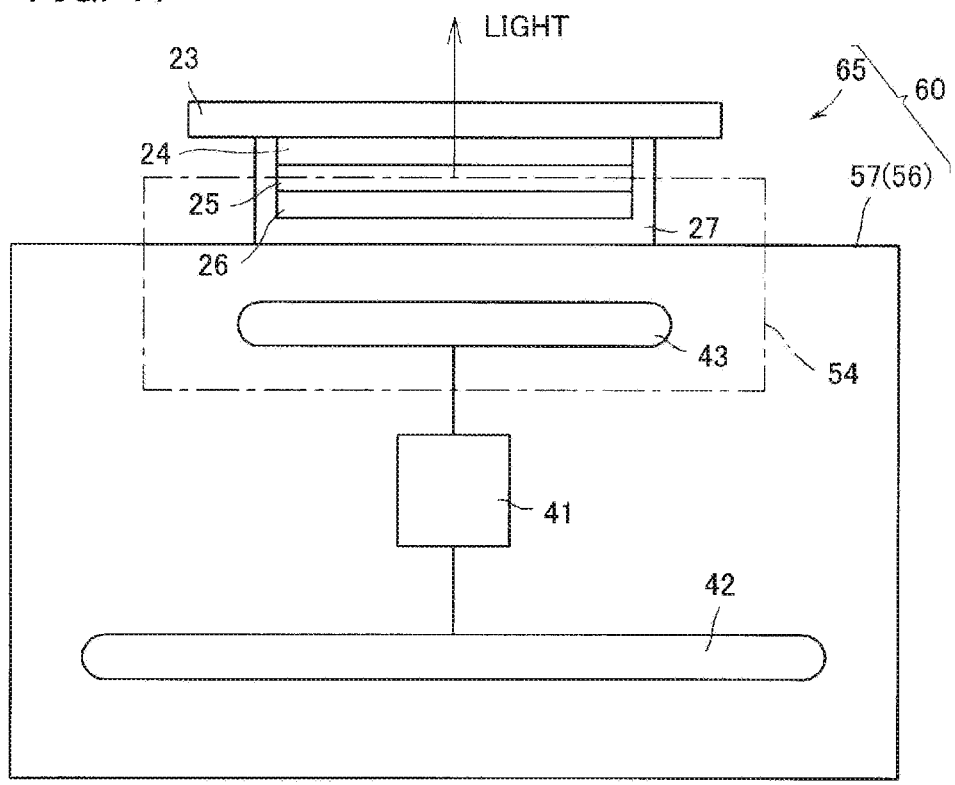
FIG. 17 is a conceptual diagram of a luminescent system relating to a fourth embodiment, being a cross section showing an organic EL device and a power supply device.

FIG. 17 shows a conceptual diagram of a luminescent system 60 in a fourth embodiment, which employs an organic EL device 65 of a bottom-emission type instead of the organic EL device 52 of a top-emission type employed in the third embodiment.

The organic EL device 65 has substantially the same configuration as that of the organic EL device 22 of a bottom-emission type and is made up of the transparent electrode layer 24 of the positive electrode (anode) side, the organic light-emitting layer 25 also referred to as the functional layer, and the electrode layer 26 of the negative electrode (cathode) side, which are stacked on the one surface 23*a* of the glass substrate 23 with a planar expanse and sealed by the sealing part 27.

Herein, in this embodiment, the electrode layer 26 of the negative electrode side in the organic EL device 65 serves as the panel-side conductive member.

Further, the organic EL device 65 is provided with a half-wave rectifying circuit, so as to rectify and use an AC current supplied from the fixed-side wall surface 57 (an electrical circuit diagram being abbreviated in the figure).

Further, in the luminescent system 51 in the third embodiment and the luminescent system 60 in the fourth embodiment, the electrode layer 11 or 26 in the organic EL device 52 has a function of the panel-side conductive member, but it is possible to separately dispose a panel-side conductive member.

Figure 18:
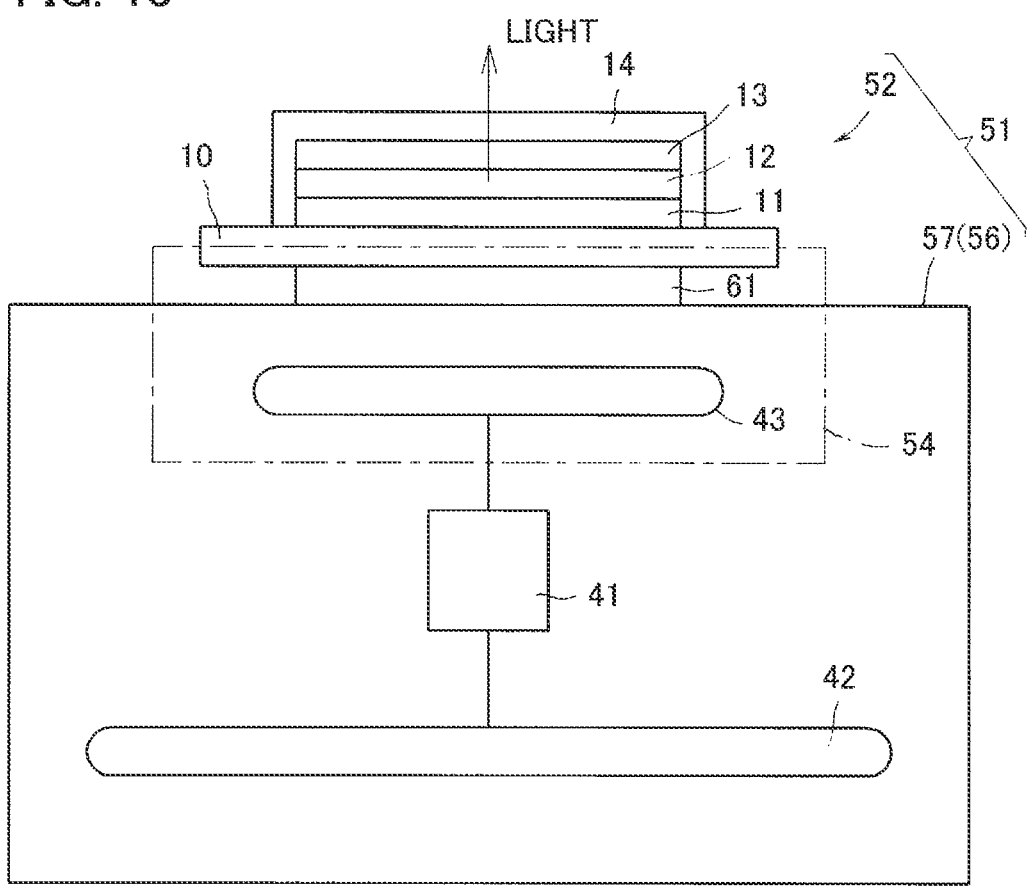
FIG. 18 is a conceptual diagram of a luminescent system relating to a fifth embodiment, being a cross section showing an organic EL device and a power supply device.

FIG. 18 is an example in which the organic EL device 52 of a top emission type is employed as well as the third embodiment. A panel-side conductive member 61 is separately arranged outside the substrate 10. The panel-side conductive member 61 and inside of the substrate 10 are connected to each other by an electric power line not shown.

Further, the organic EL device 52 is provided with a half-wave rectifying circuit, so as to rectify and use an AC current supplied from the fixed-side wall surface 57.

Figure 19:
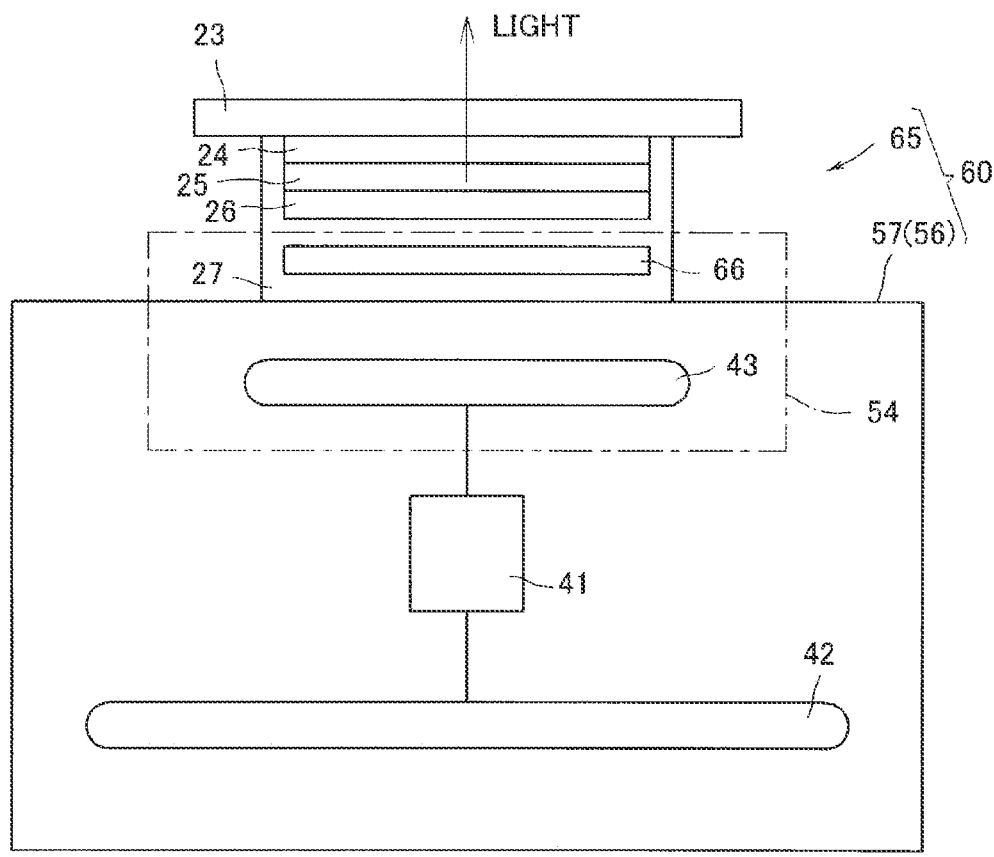
FIG. 19 is a conceptual diagram of a luminescent system relating to a sixth embodiment, being a cross section of an organic EL device and a power supply device.

FIG. 19 is an example in which the organic EL device 65 of a bottom emission type is employed as well as the fourth embodiment. A panel-side conductive member 66 is separately arranged on a face opposite the glass substrate 23. The panel-side conductive member 66 and inside of the glass substrate 23 are connected to each other by an electric power line not shown.

Further, the organic EL device 65 is provided with a half-wave rectifying circuit, so as to rectify and use an AC current supplied from the fixed-side wall surface 57.

The embodiments shown in FIGS. 16 to 19 are obtained by applying the electrical energy transmitting device disclosed in Patent document 2, which uses the organic light-emitting layer 25 and the like in the organic EL device 52, 63 as the high impedance load 45, but a high impedance load may be connected separately from the organic light-emitting layer 25.

Figure 20:
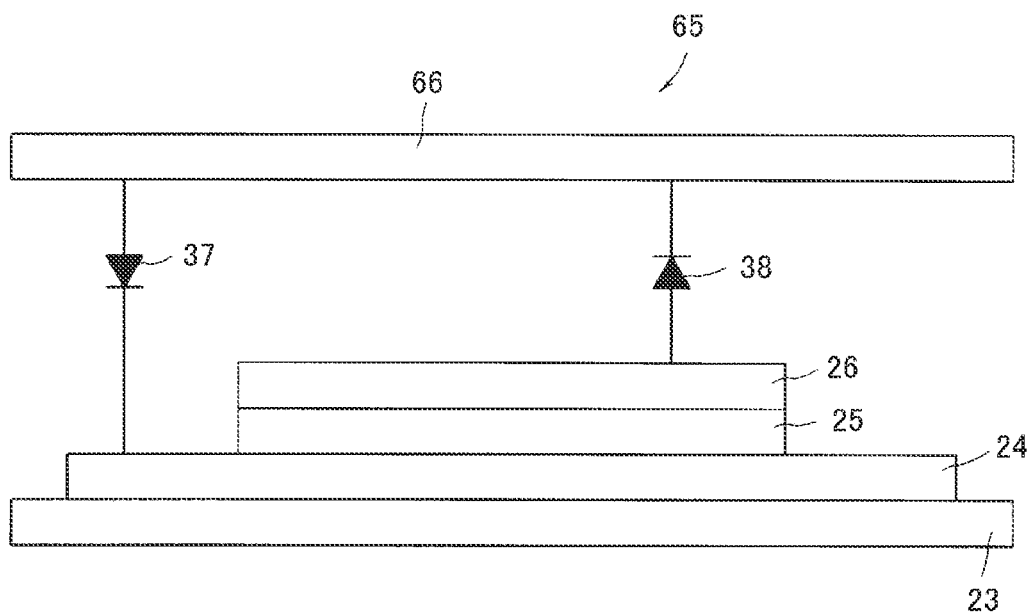
FIG. 20 is a cross-sectional schematic view showing a state in which a half-wave rectifying circuit is connected to the organic EL device in FIG. 13.

FIG. 20 is a cross-sectional schematic view schematically drawing the organic EL device 65 shown in FIG. 19 including the diodes 37 and 38 that are constituent elements of the half-wave rectifying circuit and separately arranged panel-side conductive member 66 so as to have a positional relationship similar to FIG. 4.

Figure 21:
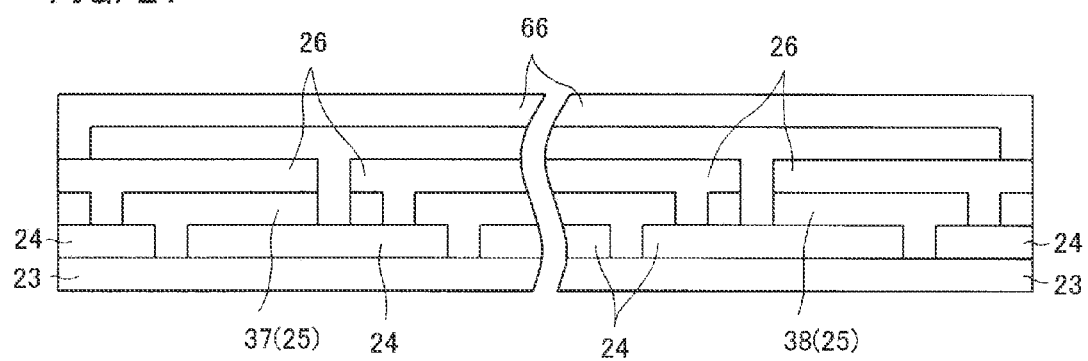
FIG. 21 is a cross section showing a state in which a half-wave rectifying circuit formed in an organic light-emitting layer is arranged adjacent to the organic EL device.

As shown in the cross section in FIG. 21, the diodes 37 and 38 that are constituent elements of the half-wave rectifying circuit each may be formed by using the organic light-emitting layer 25 as a rectifier element.

The above-mentioned embodiments also disclose the invention specified below.

(1) An organic EL device characterized in that the organic EL device is formed by stacking, on a substrate with a planar expanse, two electrode layers and an organic light-emitting layer sandwiched between the two electrode layers, wherein at least one face of the device serves as a light-emitting face, the substrate including a member or a part constituting a rectifying circuit.

(2) An organic EL device characterized in that the organic EL device is formed by stacking, on a substrate with a planar expanse, two electrode layers and an organic light-emitting layer having a pn junction and sandwiched between the two electrode layers, wherein at least one face of the device serves as a light-emitting face, the substrate having a surface divided into a main light emitting part and at least one diode part, which allows electric current to be applied in only one direction by using the pn junction of the organic light-emitting layer and is connected to the main light-emitting part.

(3) An organic EL device, which is a dependent invention of the above-mentioned inventions, characterized in that the device has four diode parts so as to form a full-wave rectifying circuit including the diode parts.

(4) An organic EL device, which is a dependent invention of the above-mentioned inventions, characterized in that the main light-emitting part is arranged on a central part of the substrate and the diode parts are formed around the main light-emitting part.

(5) An organic EL device, which is a dependent invention of the above-mentioned inventions, characterized in that the device has an electrode layer dividing part formed in at least one of the electrode layers, wherein the dividing part divides and insulates the at least one of the electrode layer, and that the device further has an organic light-emitting layer dividing part formed in the organic light-emitting layer, wherein the dividing part divides the organic light-emitting layer, one of the electrode layers penetrating the organic light-emitting layer dividing part, thereby forming a conducting part making the two electrode layers be conductive, the diode part having a diode forming part making two adjacent regions with the electrode layer dividing part as the boundary be conductive via a part of the organic light-emitting layer and the conducting part.

DESCRIPTION OF REFERENCE CHARACTERS

1, 21, 51, 60. luminescent system
2, 22, 52, 65. organic EL device
6, 56. floor
7, 57. fixed-side wall surface
8, 9. electrode (wall-side conductive member)
10. substrate
11, 26. electrode layer (panel-side conductive member)
12, 25. organic light-emitting layer
13, 24. transparent electrode layer
15, 16, 28, 29, 61, 66. electrode (panel-side conductive member)
23. glass substrate (substrate)
120, 121, 220, 221, 222, 233. electrode layer dividing part
130, 131, 132, 133, 230, 231. communication groove (electrode layer dividing part)
140, 141, 142. organic light-emitting layer dividing part
143, 240, 241, 242, 243. organic light-emitting layer dividing part
V, X, W, Y. region to be a diode part
Z. light emitting region to be a main light emitting part

The invention claimed is:

1. A luminescent system comprising a fixed-side wall surface and an organic EL (Electro Luminescence) device,
the fixed-side wall surface having a wall-side conductive member,
the organic EL device being formed by stacking, on a substrate with a planar expanse, two electrode layers and an organic light-emitting layer sandwiched between the two electrode layers, wherein the device has two faces, at least one of which serves as a light-emitting face,
the organic El device having a panel-side conductive member with a planar expanse, wherein the panel-side conductive member is embedded in or exposed from the other face opposite the light-emitting face in a region overlapping with the organic light-emitting layer, and wherein the panel-side conductive member is electrically connected to the electrode layers,
the organic EL device being arranged on the fixed-side wall surface, and
the luminescent system being configured to apply an AC current to the wall-side conductive member, so as to indirectly supply power to the organic EL device.

2. The luminescent system as defined in claim 1,
the wall-side conductive member being embedded inside the fixed-side wall surface.

3. The luminescent system as defined in claim 1,
the panel-side conductive member being disposed on a face of the device opposite the substrate.

4. The luminescent system as defined in claim 1,
the panel-side conductive member being disposed on a side of the substrate where the organic light-emitting layer is not stacked.

5. The luminescent system as defined in claim 1,
one of the two electrode layers serving as the panel-side conductive member.

6. The luminescent system as defined in claim 1,
the organic EL device being a top emission-type organic EL device in which the two electrode layers and the organic light-emitting layer are stacked on the substrate and the face opposite the substrate serves as the light-emitting face.

7. The luminescent system as defined in claim 1,
the organic EL device being a bottom emission-type organic EL device in which the substrate is a transparent substrate, the two electrode layers and the organic light-emitting layer are stacked on the transparent substrate, and the face near the substrate serves as the light-emitting face.

8. The luminescent system as defined in claim 1,
the AC current applied to the wall-side conductive member having a high voltage and a high frequency.

9. The luminescent system as defined in claim 1 further comprising a passive electrode larger than the wall-side conductive member and a high-tension, high-frequency generator,
the high-tension, high-frequency generator being connected to the wall-side conductive member and the passive electrode,
the organic EL device having a counter electrode larger than the panel-side conductive member, wherein the counter electrode is arranged at a position different from a position where the panel-side conductive member is disposed, and
the organic light-emitting layer being electrically connected to the panel-side conductive member and the counter electrode.

10. The luminescent system as defined in claim 9,
further comprising a high impedance load connected between the panel-side conductive member and the counter electrode.

11. The luminescent system as defined in claim 1,
the substrate of the organic EL device including a member or a part constituting a rectifying circuit.

12. The luminescent system as defined in claim 1,
the organic EL device being formed by stacking, on the substrate, the two electrode layers and the organic light-emitting layer having a pn junction, and
the substrate having a surface divided into a main light-emitting part and at least one diode part, wherein the diode part allows conduction in only one direction by using the pn junction of the organic light-emitting layer and wherein the diode part is connected to the main light-emitting part.

13. The luminescent system as defined in claim 12,
having four diode parts so as to form a full-wave rectifying circuit including the diode parts.

14. The luminescent system as defined in claim 12,
the main light-emitting part being arranged on a central part of the substrate, and the diode parts being formed around the main light-emitting part.

15. The luminescent system as defined in claim 12,
the organic EL device having an electrode layer dividing part formed in at least one of the electrode layers, wherein the dividing part divides and insulates the electrode layer,
the organic EL device having an organic light-emitting layer dividing part formed in the organic light-emitting layer, wherein the dividing part divides the organic light-emitting layer,
one of the electrode layers penetrating the organic light-emitting layer dividing part, thereby forming a conducting part making the two electrode layers be conductive,
the diode part having a diode forming part making two adjacent regions with the electrode layer dividing part as the boundary be conductive via a part of the organic light-emitting layer and the conducting part.

16. An organic EL (Electro Luminescence) device to be placed on a fixed-side wall surface,
wherein the fixed-side wall surface has a wall-side conductive member, to which an AC current is to be supplied, embedded therein,
the organic EL device being formed by stacking, on a substrate with a planar expanse, two electrode layers and an organic light-emitting layer sandwiched between the two electrode layers, wherein the device has two faces, at least one of which serves as a light-emitting face,
having a panel-side conductive member with a planar expanse, wherein the panel-side conductive member is embedded in or exposed from the other face opposite the light-emitting face in a region overlapping with the organic light-emitting layer, and wherein the panel-side conductive member is electrically connected to the electrode layers, and
receiving an indirect supply of power from the wall-side conductive member so as to make the organic light-emitting layer emit light.

17. The organic EL device as defined in claim 16,
the panel-side conductive member being disposed on a face opposite the substrate.

18. The organic EL device as defined in claim 16,
the panel-side conductive member being disposed on a side of the substrate where the organic light-emitting layer is not stacked.

19. The organic EL device as defined in claim 16,
one of the two electrode layers serving as the panel-side conductive member.

20. The organic EL device as defined in claim 16,
being a top emission-type organic EL device in which the two electrode layers and the organic light-emitting layer are stacked on the substrate and the face opposite the substrate serves as the light-emitting face.

21. The organic EL device as defined in claim 16,
being a bottom emission-type organic EL device in which the substrate is a transparent substrate, the two electrode layers and the organic light-emitting layer are stacked on the transparent substrate, and the face near the substrate serves as the light-emitting face.

22. The organic EL device as defined in claim 16,
having a counter electrode larger than the panel-side conductive member, wherein the counter electrode is arranged at a position different from a position where the panel-side conductive member is disposed, and
the organic light-emitting layer being electrically connected to the panel-side conductive member and the counter electrode.

23. The organic EL device as defined in claim 22,
further comprising a high impedance load connected between the panel-side conductive member and the counter electrode.

24. The organic EL device as defined in claim 16,
the substrate including a member or a part constituting a rectifying circuit.

25. The organic EL device as defined in claim 16,
being formed by stacking, on the substrate, the two electrode layers and the organic light-emitting layer having a pn junction, and
the substrate having a surface divided into a main light-emitting part and at least one diode part, wherein the diode part allows conduction in only one direction by using the pn junction of the organic light-emitting layer and wherein the diode part is connected to the main light-emitting part.

26. The organic EL device as defined in claim 25,
having four diode parts so as to form a full-wave rectifying circuit including the diode parts.

27. The organic EL device as defined in claim 25,
the main light-emitting part being arranged on a central part of the substrate, and the diode parts being formed around the main light-emitting part.

28. The organic EL device as defined in claim 25,
having an electrode layer dividing part formed in at least one of the electrode layers, wherein the dividing part divides and insulates the electrode layer, further having an organic light-emitting layer dividing part formed in the organic light-emitting layer, wherein the dividing part divides the organic light-emitting layer, one of the electrode layers penetrating the organic light-emitting layer dividing part, thereby forming a conducting part making the two electrode layers be conductive, the diode part having a diode forming part making two adjacent regions with the electrode layer dividing part as the boundary be conductive via a part of the organic light-emitting layer and the conducting part.

\* \* \* \* \*